United States Patent
Choi et al.

(10) Patent No.: US 9,389,953 B2
(45) Date of Patent: Jul. 12, 2016

(54) SEMICONDUCTOR MEMORY DEVICE AND SYSTEM CONDUCTING PARITY CHECK AND OPERATING METHOD OF SEMICONDUCTOR MEMORY DEVICE

(71) Applicants: Hun-dae Choi, Seoul (KR); Han-gi Jung, Hwaseong-si (KR)

(72) Inventors: Hun-dae Choi, Seoul (KR); Han-gi Jung, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 184 days.

(21) Appl. No.: 14/188,912

(22) Filed: Feb. 25, 2014

(65) Prior Publication Data

US 2014/0250353 A1    Sep. 4, 2014

Related U.S. Application Data

(60) Provisional application No. 61/772,302, filed on Mar. 4, 2013, provisional application No. 61/793,097, filed on Mar. 15, 2013.

(30) Foreign Application Priority Data

Mar. 15, 2013   (KR) .................. 10-2013-0028244

(51) Int. Cl.
   *G06F 11/10* (2006.01)
   *G11C 5/04* (2006.01)

(52) U.S. Cl.
   CPC ............ *G06F 11/1048* (2013.01); *G06F 11/10* (2013.01); *G11C 5/04* (2013.01)

(58) Field of Classification Search
   CPC ........ G06F 11/1048; G06F 11/10; G11C 5/04
   USPC ............................................. 714/763, 800, 80
   See application file for complete search history.

(56) References Cited

U.S. PATENT DOCUMENTS

| 5,412,788 | A | 5/1995 | Collins et al. |
|---|---|---|---|
| 6,384,633 | B1 | 5/2002 | Shiraki et al. |
| 7,710,158 | B2 | 5/2010 | Lee |
| 7,870,459 | B2 * | 1/2011 | Hazelzet ............ G06F 11/1044 361/760 |
| 8,381,064 | B2 * | 2/2013 | Hazelzet ............ G06F 11/1044 365/189.05 |
| 8,489,936 | B2 * | 7/2013 | Gower ............... G06F 11/1044 714/42 |
| 9,032,279 | B2 * | 5/2015 | Song ...................... G06F 11/10 714/800 |
| 2002/0027451 | A1 | 3/2002 | Shinozaki |
| 2004/0205433 | A1 * | 10/2004 | Gower ............... G06F 11/1044 714/733 |
| 2007/0205805 | A1 | 9/2007 | Kiehl et al. |
| 2008/0094811 | A1 * | 4/2008 | Hazelzet .................. G11C 5/04 361/760 |
| 2008/0098277 | A1 * | 4/2008 | Hazelzet ............... H03M 13/19 714/753 |
| 2009/0109771 | A1 | 4/2009 | Cox et al. |

(Continued)

FOREIGN PATENT DOCUMENTS

KR    1996-0015219    5/1996

*Primary Examiner* — John J Tabone, Jr.
(74) *Attorney, Agent, or Firm* — F. Chau & Associates, LLC

(57) ABSTRACT

A semiconductor memory device comprising of a parity check unit configured to receive a command signal and a parity signal to perform error checking in the command signal and output a parity indication signal; a delay unit including a plurality of registers configured to time delay by n clock cycles the parity indication signal and output a delayed parity indication signal; a command register configured to time delay by n clock cycles the command signal and output a delayed command; and a decoder configured to pass or block the delayed command signal based on the delayed parity indicator signal.

27 Claims, 29 Drawing Sheets

(56) References Cited

U.S. PATENT DOCUMENTS

| | | | |
|---|---|---|---|
| 2011/0055671 A1* | 3/2011 | Kim | G06F 11/1028 714/800 |
| 2011/0138261 A1 | 6/2011 | Bains et al. | |
| 2012/0110423 A1* | 5/2012 | Song | H03M 13/098 714/799 |
| 2013/0163354 A1* | 6/2013 | Song | G11C 7/1006 365/194 |
| 2013/0346836 A1* | 12/2013 | Song | G06F 11/10 714/800 |
| 2014/0181567 A1* | 6/2014 | Choi | G06F 1/12 713/400 |

* cited by examiner

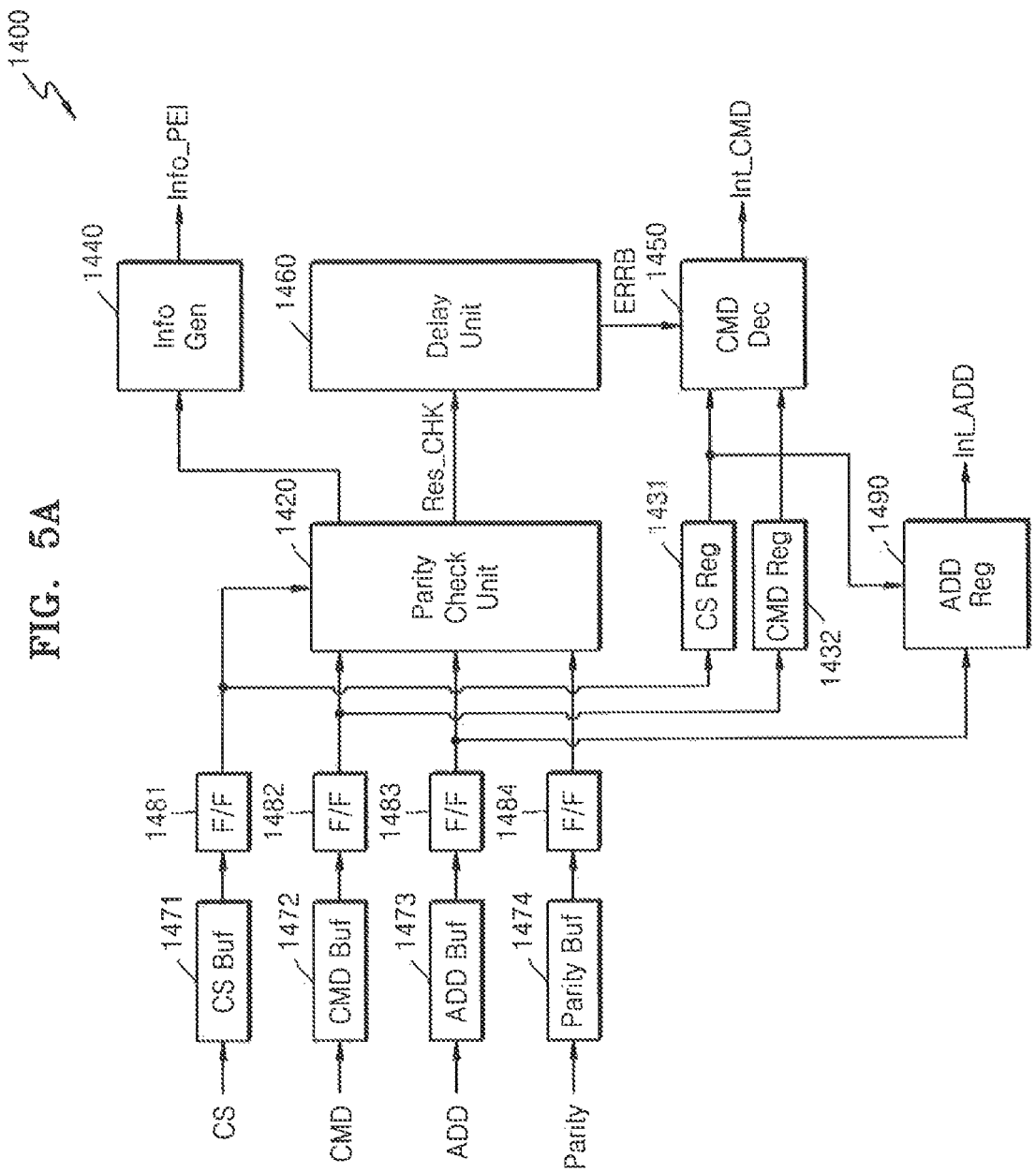

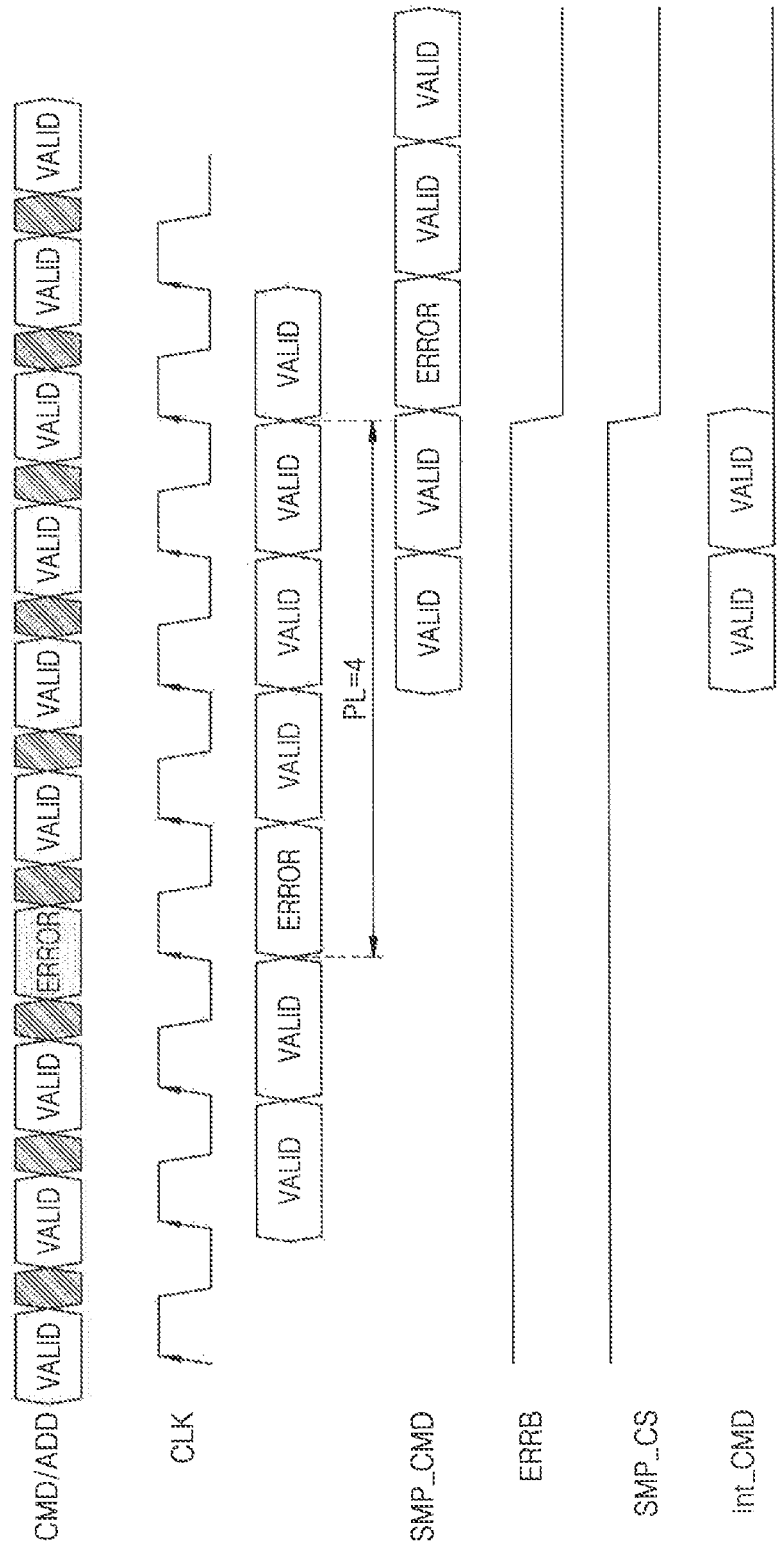

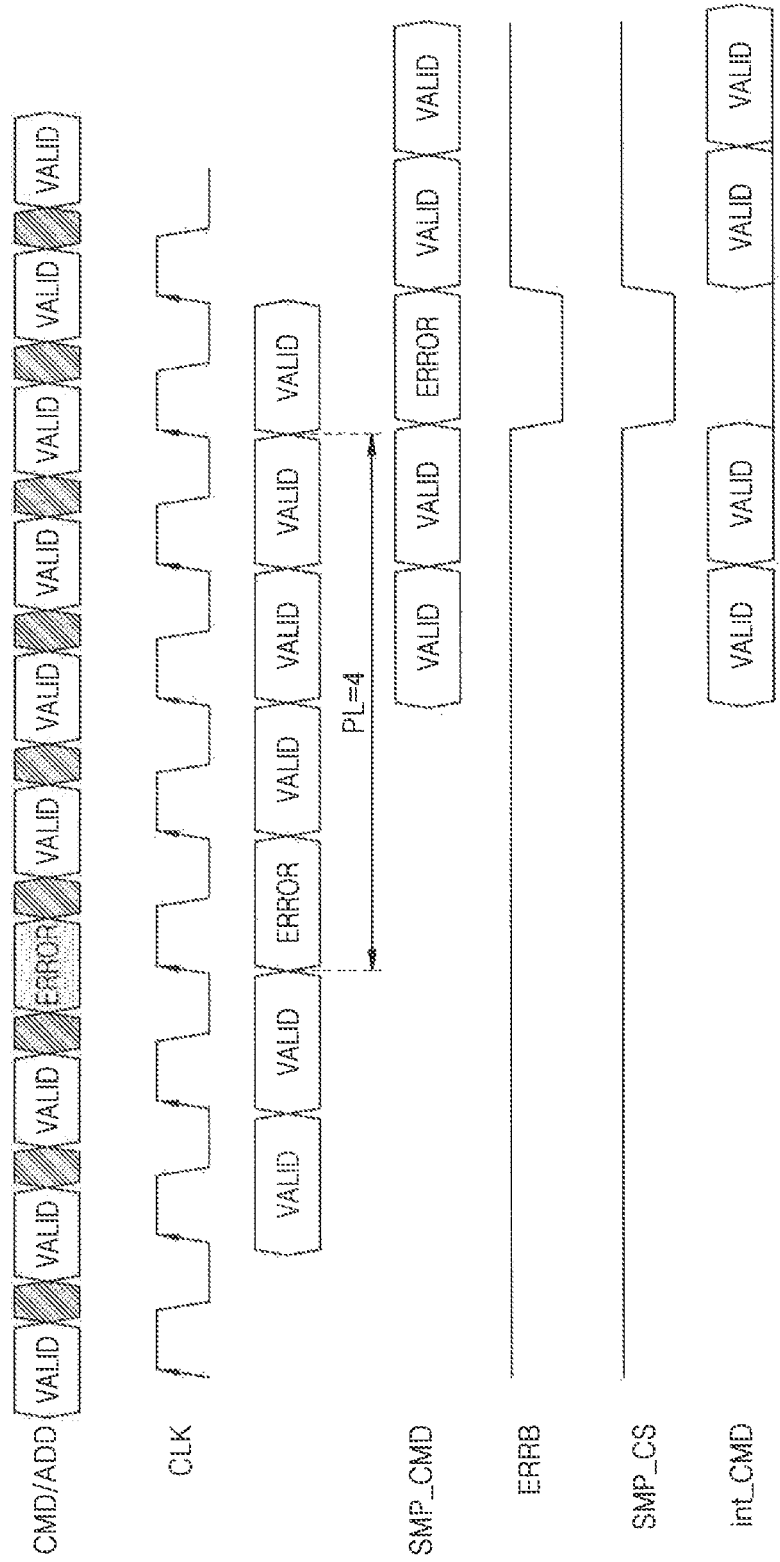

SEMICONDUCTOR MEMORY DEVICE AND SYSTEM CONDUCTING PARITY CHECK AND OPERATING METHOD OF SEMICONDUCTOR MEMORY DEVICE

CROSS-REFERENCE TO RELATED APPLICATIONS

This application claims the benefit of U.S. Provisional Application Ser. No. 61/772,302 filed on Mar. 4, 2013, U.S. Provisional Application Ser. No. 61/793,097 filed on Mar. 15, 2013, and Korean Patent Application No. 10-2013-0028244, filed on Mar. 15, 2013, in the Korean intellectual Property Office, the disclosure of which is incorporated by reference in its entirety herein.

BACKGROUND

The inventive concept relates to a semiconductor memory device, and more particularly, to a semiconductor memory device performing a parity check, a memory system, and a method of operating the semiconductor memory device.

As an operating speed of a semiconductor memory device increases, error probability of signals transmitted or received in a memory system may increase. For example, a dynamic random access memory (DRAM), which is an example of a semiconductor memory device, is a memory device having finite data retention characteristics; the DRAM receives, for example, a command, an address or a chip select signal from a memory controller to perform a memory operation requested by the memory controller via an internal operation such as command decoding or address controlling. Error free operation of a semiconductor memory device is crucial irrespective of the density and speed capacity of the memory device.

SUMMARY

According to an embodiment of the present inventive concept, a semiconductor memory device comprising a parity check unit configured to receive a command signal and a parity signal to perform error checking in the command signal and output a parity indication signal; a timing unit including a plurality of registers configured to time delay by n clock cycles the parity indication signal and output a delayed parity indication signal; a command register configured to time delay by n clock cycles the command signal and output a delayed command; and a decoder configured to pass or block the delayed command signal based on the delayed parity indicator signal.

According to an embodiment of the present inventive concept, the parity check unit performs the error checking based on a state of the chip select signal.

According to an embodiment of the present inventive concept, the parity check unit further receives an address, and performs the error checking by using the command, the address, and the parity signal.

According to an embodiment of the present inventive concept, the semiconductor memory device further includes an address register configured to time delay by n clock cycles the address and output a delayed address. The address may comprise a bank address and a bank group address.

According to an embodiment of the present inventive concept, the semiconductor memory device further includes a chip select register configured to time delay the chip select signal and output a delayed chip select signal, and a decoder further configured to pass or block the delayed command signal based on the state of the delayed chip select signal.

According to an embodiment of the present inventive concept, the timing unit is further configured to hold the delayed parity indication signal in an error indication state for m clock cycles, wherein m=n−1.

According to an embodiment of the present inventive concept, a semiconductor memory device comprising a parity check unit configured to receive address signals and a parity signal to perform error checking in the address signals and output a parity indication signal; a timing unit including a plurality of registers configured to time delay by as clock cycles the parity indication signal and output a delayed parity indication signal; a address register configured to time delay by n clock cycles the address signals and output a delayed address; and a decoder configured to pass or block the delayed address signals based on the delayed parity indicator signal.

According to an embodiment of the present inventive concept, a method of controlling a memory device, comprising receiving a command and address signals and a parity signal to perform error checking in the command and address signals and output a parity indication signal; time delaying by n clock cycles the parity indication signal and output a delayed parity indication signal; time delaying by n clock cycles the command and address signals and output a delayed command and address signals; and passing or blocking the delayed command and address signals based on the delayed parity indicator signal.

A memory system comprising a memory controller configured to control access to and from a memory device, the memory controller comprising a parity signal generator configured to generate a parity signal based on bit values of a command; an information receiver configured to receive parity error information from the memory device; and an error command output control unit configured to control outputting of the command to the memory device based on a state of the parity error information; and the memory device comprising a parity check unit configured to receive the command and the parity signal to perform error checking in the command and output a parity indication signal; a delay unit including a plurality of registers configured to time delay by n clock cycles the parity indication signal and output a delayed parity indication signal; a command register configured to time delay by clock cycles the command and output a delayed command; and a decoder configured to pass or block the delayed command based on the delayed parity indicator signal.

BRIEF DESCRIPTION OF THE DRAWINGS

Exemplary embodiments of the inventive concept will be more clearly understood from the following detailed description taken in conjunction with the accompanying drawings in which:

FIGS. 5A and 5B are block diagrams illustrating a semiconductor memory device according to another embodiment of the inventive concept;

FIGS. 10A, 10B, and 11 are timing diagrams relating to error checking of a semiconductor memory device according to embodiments of the inventive concept;

DETAILED DESCRIPTION OF THE EMBODIMENTS

Figure 1:
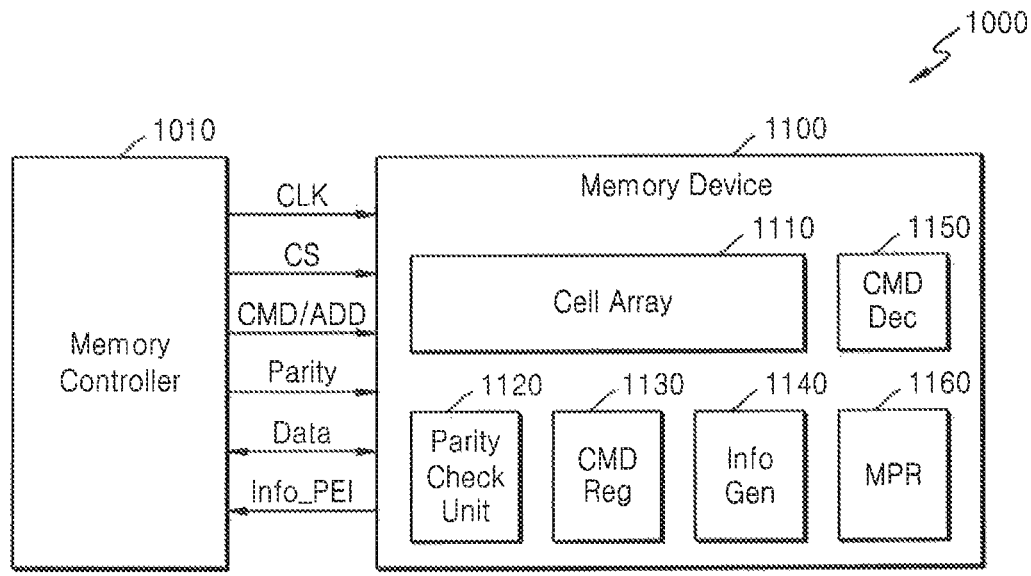
FIG. 1 is a block diagram illustrating a semiconductor memory device and a memory system according to an embodiment of the inventive concept.

Hereinafter, the inventive concept will be described in detail by explaining preferred embodiments of the inventive concept with reference to the attached drawings. Like reference numerals in the drawings denote like elements.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram illustrating a memory system 1000 that includes a semiconductor memory device 1100 according to an embodiment of the inventive concept. The memory system 1000 may include a memory controller 1010, a cell array 1110, a parity check unit 1120, a command register 1130, an information generator 1140, and a command decoder 1150. The semiconductor memory device 1100 may further include a multiple purpose register (MPR) 1160. The elements of the semiconductor memory device 1100 illustrated in FIG. 1 are included to illustrate operations of a parity check according to an embodiment of the inventive concept, other elements for conducting a memory operation such as reading or writing of data (not shown) may be further included in the semiconductor memory device 1100.

The memory controller 1010 provides various signals to the semiconductor memory device 1100 to control a memory operation. For example, the memory controller 1010 provides a clock signal CLK, a chip select signal CS, a command CMD, and an address ADD to the semiconductor memory device 1100, and data for reading and writing operations is transmitted or received between the memory controller 1010 and the semiconductor memory device 1100.

Also, according to an embodiment of the inventive concept, the memory controller 1010 may provide a parity signal to the semiconductor memory device 1100. A parity signal may include one bit or at least two bits, and may have a bit value according to a logic state of a command CMD and an address ADD. A command. CMD and an address ADD may each be formed of a plurality of bits, and a bit value of a parity signal Parity may be determined according to a bit value of the command CMD and the address ADD. For example, if the number of bits of a command CMD, an address ADD, and a parity signal Parity having a logic high from among bit values thereof is set to be provided in an even number, and the number of bits having a logic high from among bits constituting the command CMD and the address ADD is an odd number, then the parity signal Parity may have a logic high value; on the other hand, if the number of bits having a logic high from among bits constituting the command CMD and the address ADD is an even number, the parity signal Parity may have a logic low value. According to another embodiment of the inventive concept, when a parity check is conducted only with respect to a command CMD, a bit value of a parity signal Parity may be determined according to a bit value of bits constituting the command CMD, or if a parity check is conducted only with respect to an address ADD, a bit value of a parity signal Parity may be determined according to a bit value of bits constituting the address ADD.

The parity check unit 1120 conducts a parity check with respect to at least one of a command CMD and an address ADD by using a parity signal Parity received from the memory controller 1010. According to an embodiment wherein a parity check is conducted with respect to a command CMD and an address ADD, the parity check unit 1120 receives the command CMD, the address ADD, separate check bit values of the command CMD and the address ADD, and the parity signal Parity to generate a parity check result. The information generator 1140 generates parity error information Info_PEI indicating whether there is a parity error or not, according to the parity check result, and outputs the result to the memory controller 1010.

As a result of a parity check, if no parity error is generated, a command CMD is normally provided to the command decoder 1150 and this an internal command is generated, and a memory operation is conducted in response to the internal command. In consideration of time needed for the parity check, the command CMD may be temporarily stored in the command register 1130, and the command CMD stored in the command register 1130 may be provided to the command decoder 1150 in time synchronization with the parity check result when it is provided to the command decoder 1150. The command register 1130 may be formed of a unit such as a shift register, and another storage unit may be further included in the semiconductor memory device 1100 to temporarily store a chip select signal CS provided to the command decoder 1150 or an address ADD provided to a row/column decoder (not shown).

if a parity error is generated, further memory operation is prevented by blocking generation of an internal command. For example, the command decoder 1150 may be disabled. Alternatively, output of the command CMD from the command register 1130 is blocked.

Meanwhile, the MPR 1160 may include registers that store various pieces of information in the semiconductor memory device 1100, and may be able to store, for example, a command CMD/address ADD to which a parity error is generated as a result of a parity check conducted according to an embodiment of the inventive concept. According to consultation with the memory controller 1010, at least some pieces of information stored in the MPR 1160 may be provided to the memory controller 1010. The memory controller 1010 may receive information of a command CMD/address ADD in which an error is generated, by accessing the MPR 160. The memory controller 1010 may conduct an operation such as detection of an error pattern of a command CMD/address ADD received by using the semiconductor memory device 1100, by analyzing the information stored in the MPR 1160.

Meanwhile, when the memory controller 1010 requests an actual memory operation to be conducted, a chip select signal CS may be activated and output with a command CMD, and when a chip select signal CS is inactivated, the semiconductor memory device 1100 may be in a non-operational state. Accordingly, the parity check unit 1120 may be set to operate when a chip select signal CS is activated, and for example, a chip select signal CS may be used as a signal to control enablement of the parity check unit 1120. In addition, if an activated chip select signal CS is provided to the command decoder 1150, the command decoder 1150 may generate an appropriate internal command, and accordingly, if a parity error is generated, generation of the internal command may be prevented by blocking provision of a chip select signal CS to the command decoder 1150. Herein, a chip select signal CS may be described as being included in a command CMD. Alternatively, a chip select signal CS may be is either included even when the chip select signal CS is not explicitly described in the description provided below.

Figure 2:
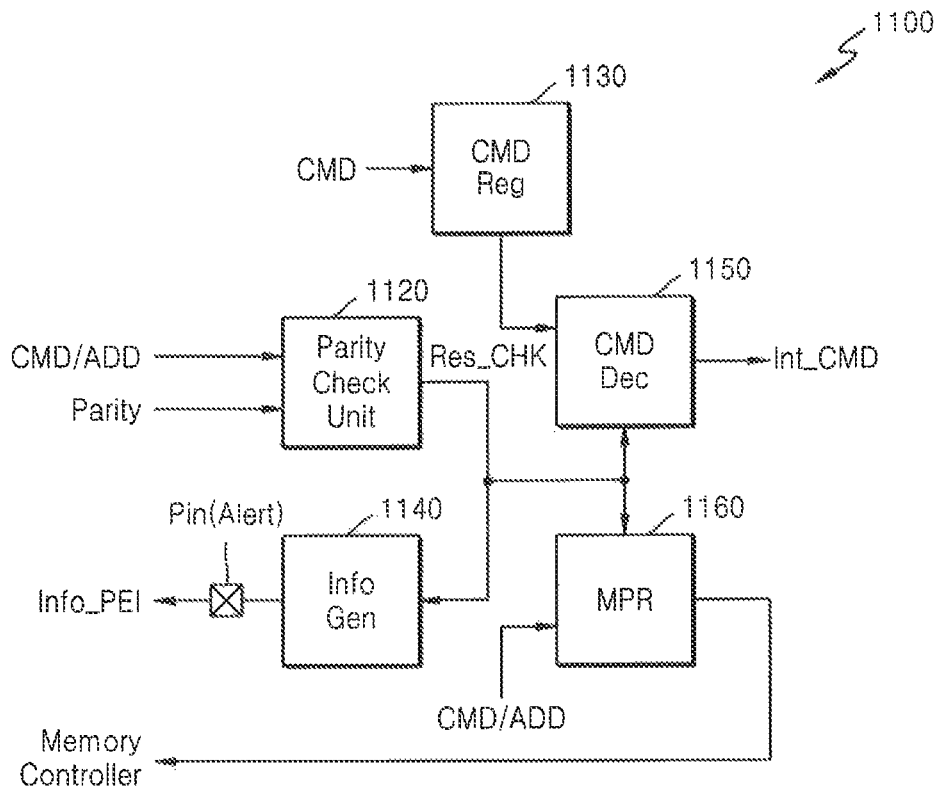
FIG. 2 is a block diagram illustrating an operation of the semiconductor memory device of FIG. 1 according to an embodiment of the inventive concept.

FIG. 2 is a block diagram illustrating an operation of the semiconductor memory device 1100 according to an embodiment of the inventive concept. Referring to FIGS. 1 and 2, a command and an address CMD/ADD and a parity signal Parity transmitted from the memory controller 1010 is provided to the parity check unit 1120, and the parity check unit 1120 checks a bit value of each of the command CMD, the address ADD, and the parity signal Parity to generate a parity check result Res_CHK.

The information generator 1140 generates parity error information Info_PEI according to the parity check result Res_CHK and outputs the same to the memory controller 1010. The semiconductor memory device 1100 may include a plurality of pins for communication with the memory controller 1010, and the semiconductor memory device 1200 may include an information pin Alert for outputting parity error information Info_PEI. For example, if no parity error is generated, the information generator 1140 may output inactivated parity error information Info_PEI, but if a parity error is generated, the information generator 1140 may output parity error information Info_PEI. The memory controller 1010 may receive parity error information Info_PEI, and control a command output for a subsequent memory operation according to the parity error information Info_PEI.

In addition, an operation of generating an internal command Int_CMD of the semiconductor memory device 1100 may be controlled according to a parity check result Res_CHK. If no parity error is generated, the command decoder 1150 may decode a command CMD to generate and output an internal command Int_CMD. In consideration of time needed for a parity check operation, the command CMD may be delayed a predetermined amount of time via the command register 1130 and then may be provided to the command decoder 1150. On the other hand, if a parity error is generated, provision of a command CMD to the command decoder 1150 may be prevented or a signal received by using the command decoder 1150 may be blocked, thereby preventing output of an internal command Int_CMD.

Figure 3:
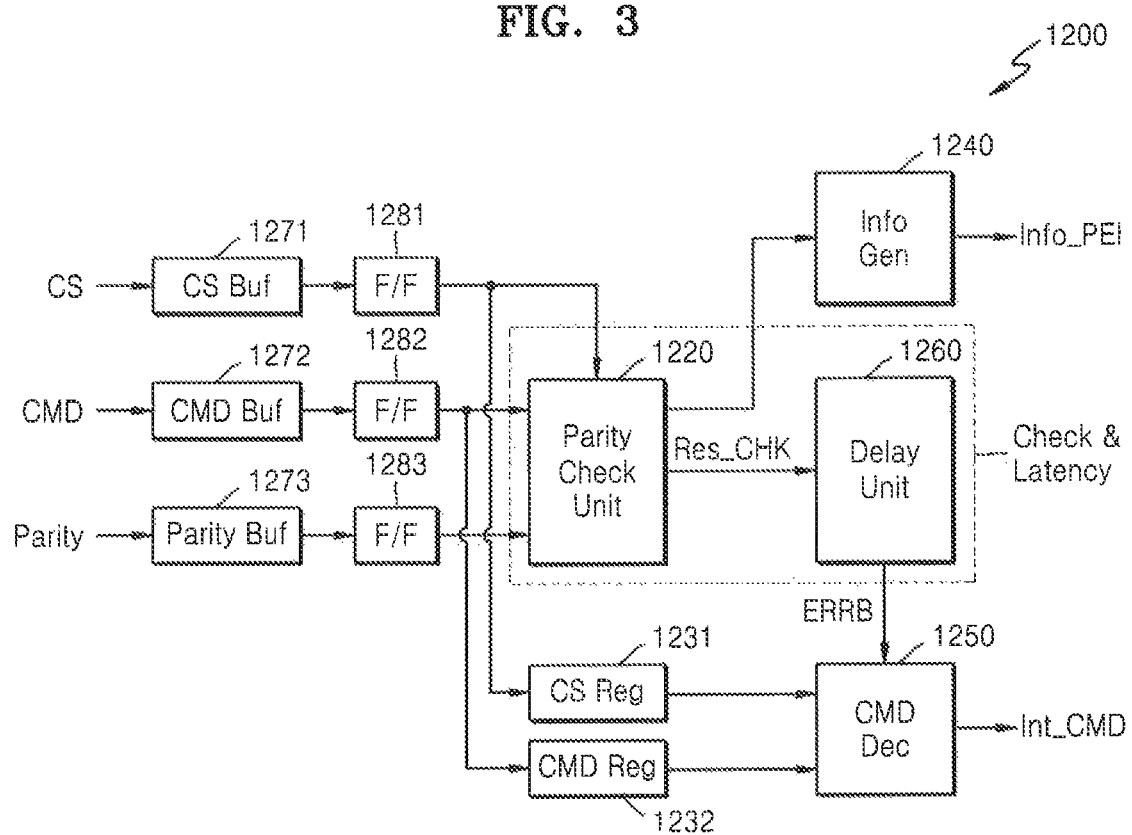
FIG. 3 is a block diagram illustrating a semiconductor memory device according to an embodiment of the inventive concept.

FIG. 3 is a block diagram illustrating a semiconductor memory device 1200 according to an embodiment of the inventive concept. The semiconductor memory device 1200 may include a parity check unit 1220, at least one register 1231 and 1232, an information generator 1240, a command decoder 1250, a delay unit 1260, at least one buffer 1271, 1272, 1273, and at least one flip-flop 1281, 1282, and 1283. The at least one register 1231 and 1232 corresponds to a storage unit that stores a chip select signal and a command, and may include, for example, a chip select signal register 1231 and a command register 1232. In addition, the at least one buffer 1271, 1272, and 1273 may include a first buffer 1271 that stores a chip select signal CS, a second buffer 1272 that stores a command CMD, and a third buffer 1273 that stores a parity signal Parity. Also, the at least one flip-flop 1281, 1282, and 1283 may include a first flip flop 1281 that stores a chip select signal CS, a second flip flop 1282 that stores a command CMD, and a third flip flop 1283 that stores a parity signal Parity.

Although FIG. 3 illustrates a buffer, a flip flop or a register as a unit for storing a chip select signal CS, a command CMD, and a parity signal Parity, the embodiments of the inventive concept are not limited thereto, and other storage units may be used to conduct a storing operation (or a delay operation). Also, while the parity check unit 1220 and the delay unit 1260 are illustrated as separate functional blocks, a single functional block (a parity check and latency unit) performing the functions of the parity check unit 1220 and the delay unit 1260 may also be included instead.

The first buffer 1271 receives and buffers a chip select signal CS, and may convert a chip select signal CS from an external TTL level to a CMOS level. Similarly, the second and third buffers 1272 and 1273 may convert a signal from an external TTL level to a signal at a CMOS level, and the second buffer 1272 receives and buffers a command CMD, and the third buffer 1273 receives a parity signal Parity and buffers the same.

Each of the first through third flip flops 1281 through 1283 synchronizes with an internal clock signal of the semiconductor memory device 1200 and input or output a signal. The first flip flop 1281 synchronizes a chip select signal CS transmitted from the first buffer 1271 with an internal clock signal and outputs the same. Also, the second flip flop 1282 synchronizes a command CMD transmitted from the second buffer 1272 with an internal clock signal and outputs the same, and the third flip flop 1283 synchronizes a parity signal Parity transmitted from the third buffer 1273 with an inner clock signal and outputs the same.

The parity check unit 1220 performs a parity check operation with respect to a command CMD synchronized with an internal clock signal, for example, by using bit values of the command CMD as described above and a bit value of the parity signal Parity. The parity check unit 1220 may perform a parity check in response to a chip select signal CS. A parity check result Res_CHK is provided to the information generator 1240, and the information providing unit 1240 generates parity error information Info_PEI indicating whether a parity error is generated or not by using the parity check result Res_CHK and outputs the same to the memory controller.

Meanwhile, a chip select signal CS and a command CMD transmitted from the first and second flip flops 1281 and 1282 may be provided to a chip select signal register 1231 and a command register 1232, respectively. To compensate for a time delay needed for a parity check operation with respect to a command CMD, the chip select signal register 1231 and the command register 1232 temporality store the chip select signal CS and the command CMD respectively. Meanwhile, the command delay unit 1260 may receive a parity check result Res_CHK from the parity check unit 1220 and output a signal obtained by delaying the parity check result Res_CHK to the command decoder 1250. Accordingly, a chip select signal CS and a command CMD synchronized with the parity check result Res_CHK may be provided to the command decoder 1250. The command decoder 1250 decodes a chip select signal CS and a command CMD and generates an internal command Int_CMD or blocks output of an internal command Int_CMD if a parity error is generated. According to the above-described operation, as the semiconductor memory device 1200 operates at a high speed and if an error occurs in receiving a command CMD, generation of an internal command Int_CMD may be prevented.

Figure 4:
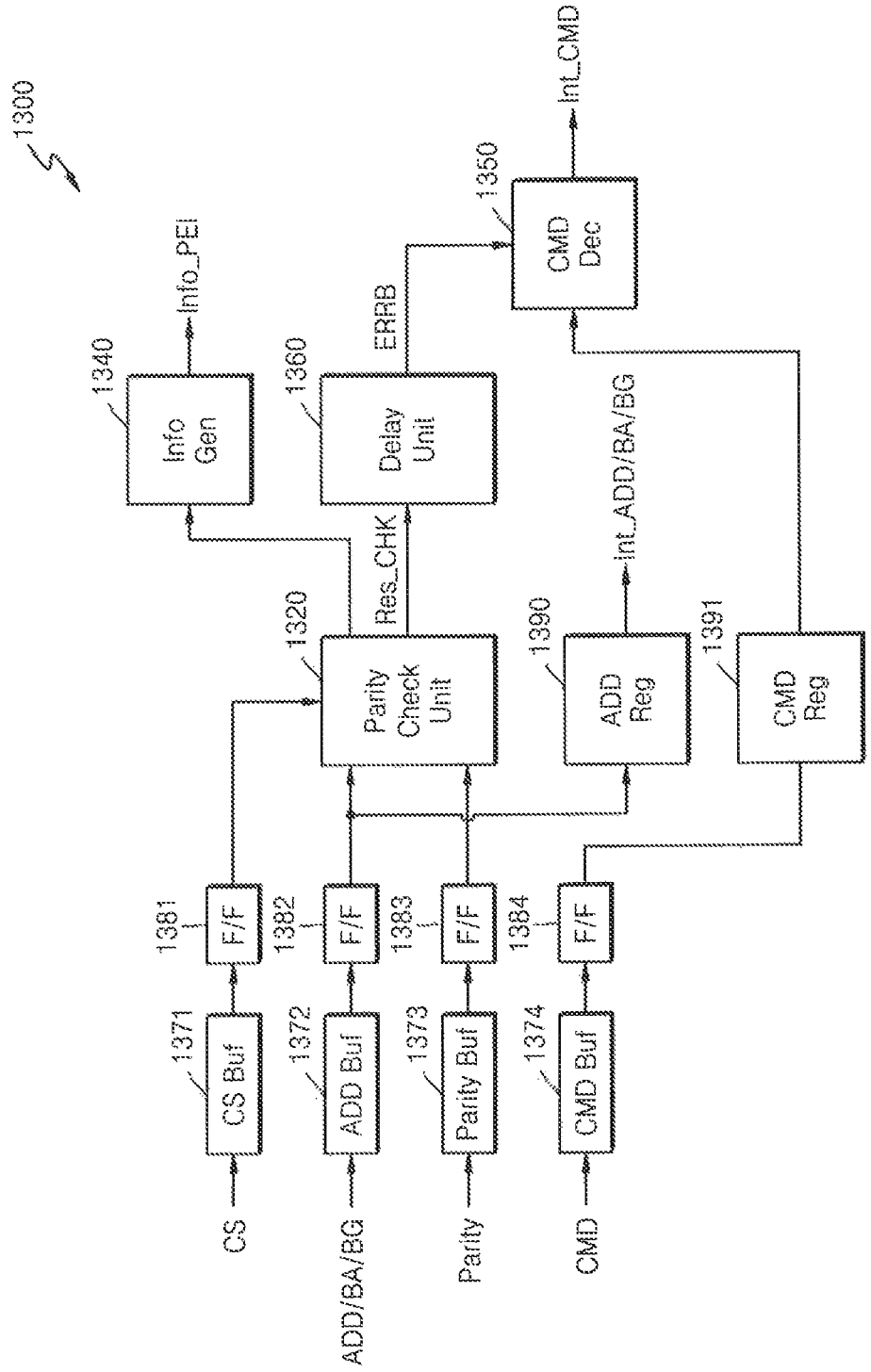
FIG. 4 is a block diagram illustrating a semiconductor memory device according to another embodiment of the inventive concept.

FIG. 4 is a block diagram illustrating a semiconductor memory device 1300 according to an embodiment of the inventive concept. A parity check operation with respect to an address ADD transmitted from a memory controller may be provided.

The semiconductor memory device 1300 may include a parity check unit 1320, an information generator 1340, a command decoder 1350, a delay unit 1360, at least one buffer 1371, 1372, 1373, and 1374, and at least one flip flop 1381, 1282, 1383, and 1384. Also, the semiconductor memory device 1300 may further include an address register 1390 that receives an address ADD/BA/BG provided by the memory controller and outputs an internal address Int_ADD/BA/BG. A cell array (not shown) included in the semiconductor memory device 1300 may include a plurality of banks, and at least two banks may be defined as a single bank group. An address ADD/BA/BG may further include, besides the address ADD described above, a bank address BA and a bank group address BG.

The at least one buffer 1371, 1372, 1373, and 1374 may include a first buffer 1371 that stores a chip select signal CS, a second buffer 1372 that stores an address ADD/BA/BG, a third buffer 1373 that stores a parity signal Parity, and a fourth buffer 1374 that stores a command CMD. Also, the at least one flip flop 1381, 1382, and 1383 may include a first flip flop 1381 that stores a chip select signal CS, a second flip flop 1382 that stores an address ADD/BA/BG, a third flip flop 1383 that stores a parity signal Parity, and a fourth flip flop 1384 that stores a command CMD.

When performing a parity check operation with respect to an address ADD/BA/BG, the address ADD/BA/BG may include at least one bit, and a bit value of a parity signal may be determined according to bit values of bits constituting the address ADD/BA/BG. For example, if the number of bits of the address ADD/BA/BG having a logic high is an odd number, a parity signal Parity may have a logic high value, and if the number of bits having a logic high is an even number, a parity signal Parity may have a logic low value.

Similar to the above-described embodiment, the parity check unit 1320 performs a parity check operation with respect to an address ADD/BA/BG synchronized with an internal clock signal, and for example, by using bit values of bits included in an address ADD/BA/13G as described above and a hit value of a parity signal Parity. A parity check result Res_CHK is provided to the information generator 1340, and the information providing unit 1340 generates parity error information Info_PEI indicating whether a parity error is generated or not by using the parity check result Res_CHK and outputs the same to the memory controller. Also, the parity check result Res_CHK is provided to the delay unit 1360, and a signal ERRB transmitted from the delay unit 1360 is provided to the command decoder 1350. The signal ERRB transmitted from the delay unit 1360 may be a signal that is obtained by delaying the parity check result Res_CHK, and thus, the signal ERRB transmitted from the delay unit 1360 may also be referred to as a parity check result ERRB. The command decoder 1350 may decode a command CMD to generate an internal command Int_CMD or may not generate an internal command Int_CMD, according to the parity cheek result ERRB. Command register 1391 and address register 1390 temporarily store the internal address and command and to output the address and command to respective decoders synchronized with ERRB.

According to the above-described operation, as the semiconductor memory device 1300 operates and an error occurs in receiving an address ADD/BA/BG, generation of an internal command Int_CMD is prevented, thereby preventing a memory operation by an address ADD having an error.

Figure 5B:
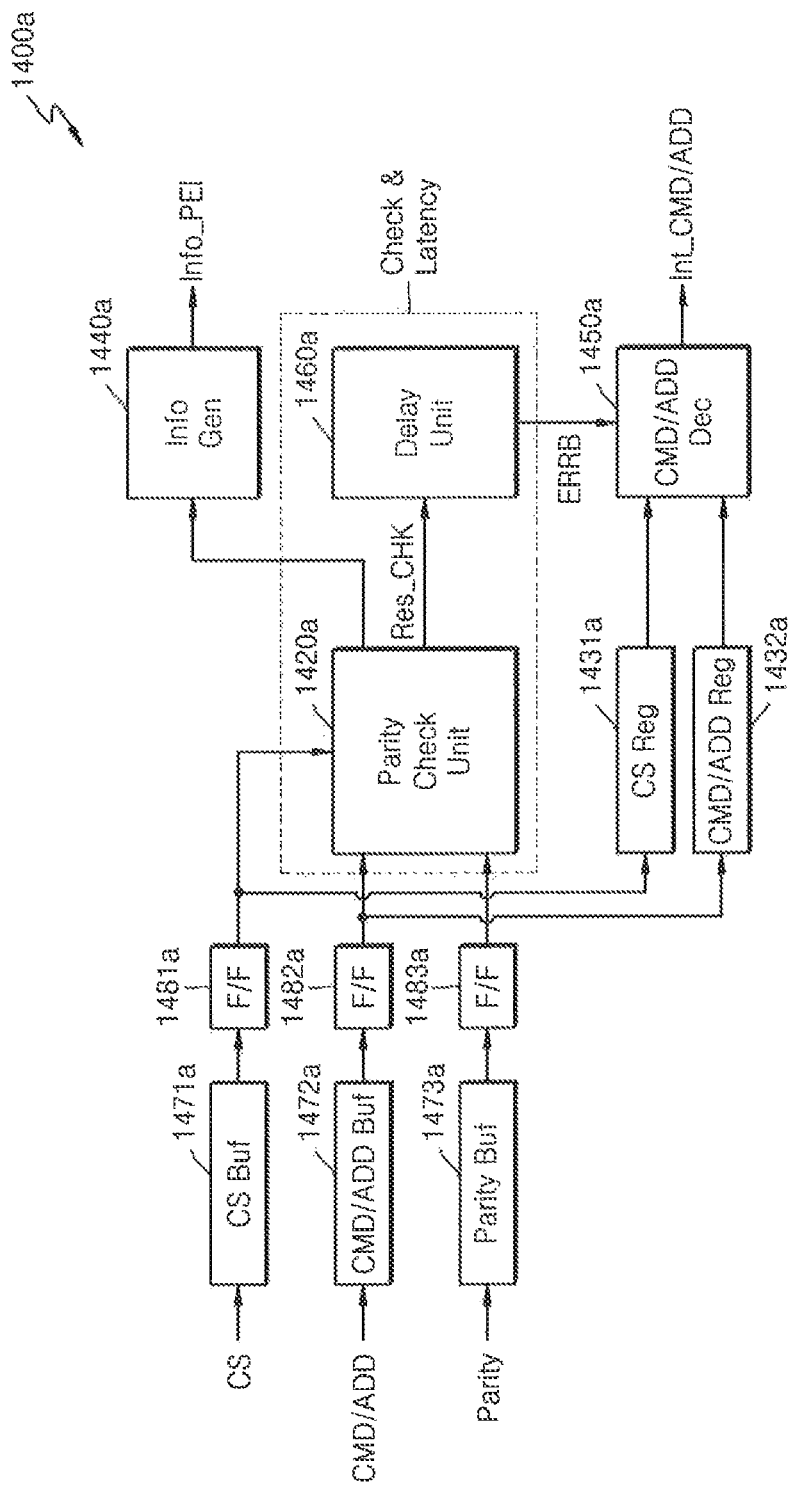

FIGS. 5A and 5B are block diagrams illustrating a semiconductor memory device 1400 according to another embodiment of the inventive concept. In FIGS. 5A and 5B, a parity check operation with respect to a command CMD and an address ADD is illustrated.

The semiconductor memory device 1400 may include a parity check unit 1420, at least one register 1431 and 1432, an information generator 1440, a command decoder 1450, a delay unit 1460, at least one buffer 1471, 1472, 1473, and 1474, and at least one flip flop 1481, 1482, 1483, and 1484, and an address register 1490. The at least one register 1431 and 1432 may include a chip select signal register 1431 and a command register 1432.

Also, the at least one buffer 1471, 1472, 1473, and 1474 may include a first buffer 1471 that stores a chip select signal CS, a second buffer 1472 that stores a command CMD, a third buffer 1473 that stores an address ADD, and a fourth buffer 1474 that stores a parity signal Parity. Also, the at least one flip flop 1481, 1482, 1483, and 1484 may include a first flip flop 1481 that stores a chip select signal CS, a second flip flop 1482 that stores a command CMD, a third flip flop 1483 that stores an address ADD, and a fourth flip flop 1484 that stores a parity signal Parity. In embodiments having a plurality of banks in the semiconductor memory device 1400, the address ADD may further include a bank address and a bank group address.

Similar to the above-described embodiments, the parity check unit 1420 performs a parity check operation with respect to a command CMD and an address ADD synchronized with an internal clock signal, and by using, for example, bit values of bits included in a command CMD and an address ADD as described above and a bit value of a parity signal Parity. A parity check result Res_CHK is provided to the information generator 1440, and the information providing unit 1440 generates parity error information Info_PEI indicating whether a parity error is generated by using the parity check result Res_CHK and outputs the same to the memory controller. Also, a parity check result ERRB from the delay unit 1460 is provided to the command decoder 1450.

Also, a chip select signal CS and a command CMD from the first and second flip flops 1481 and 1482 may be provided to the chip select signal register 1431 and the command register 1432, respectively, and an address ADD from the third flip flop 1483 may be provided to the address register 1490. In synchronization with the parity check result ERRB from the delay unit 1460 provided to the command decoder 1450, a chip select signal CS and a command CMD respectively from the chip select signal register 1431 and the command register 1432 are provided to the command decoder 1450. According to a parity check result Res_CHK, the command decoder 1450 may generate an internal command Int_CMD and output the same, or may block output of an internal command Int_CMD.

Also, the address register 1490 receives an address ADD from the memory controller and generates an internal address Int_ADD and outputs the same. To output an internal address Int_ADD in synchronization with an output timing of the internal command. Int_CMD, the address register 1490 may also output the address ADD by delaying the same. Also, the address register 1490 may output an internal address Int_ADD in response to a chip select signal CS. According to the above-described operation, as the semiconductor memory device 1400 operates and if an error occurs in receiving a command CMD and an address ADD, generation of an internal command Int_CMD may be prevented.

FIG. 5B illustrates a single functional block used as a unit for processing a command CMD and an address ADD in regard to conducting a parity check with respect to a command CMD and an address ADD. A semiconductor memory device 1400*a* may include a parity check unit 1420*a*, at least one register 1431*a* and 1432*a*, an information generator 1440*a*, a command/address decoder 1450*a*, a delay unit 1460*a*, at least one buffer 1471*a*, 1472*a*, and 1473*a*, and at least one flip flop 1481*a*, 1482*a*, and 1483*a*. The at least one register 1431*a* and 1432*a* may include a chip select signal register 1431*a* and a command/address register 1432*a*.

A command/address CMD/ADD from the memory controller passes through the second buffer 1472*a* and the second flip flop 1482*a* to be provided to the parity check unit 1420*a*. Also, a command/address CMD/ADD from the second flip flop 1482*a* is provided to the command/address decoder 1450*a* via the command/address register 1432*a*. The parity check unit 1420*a* outputs a parity check result Res_CHK with respect to the received command/address CMD/ADD, and a command/address CMD/ADD from the command/address register 1432*a* is provided to the command/address decoder 1450*a* in synchronization with a parity check result ERRB obtained by delaying the parity check result Res_CHK to the command/address decoder 1450*a*.

Figure 6:
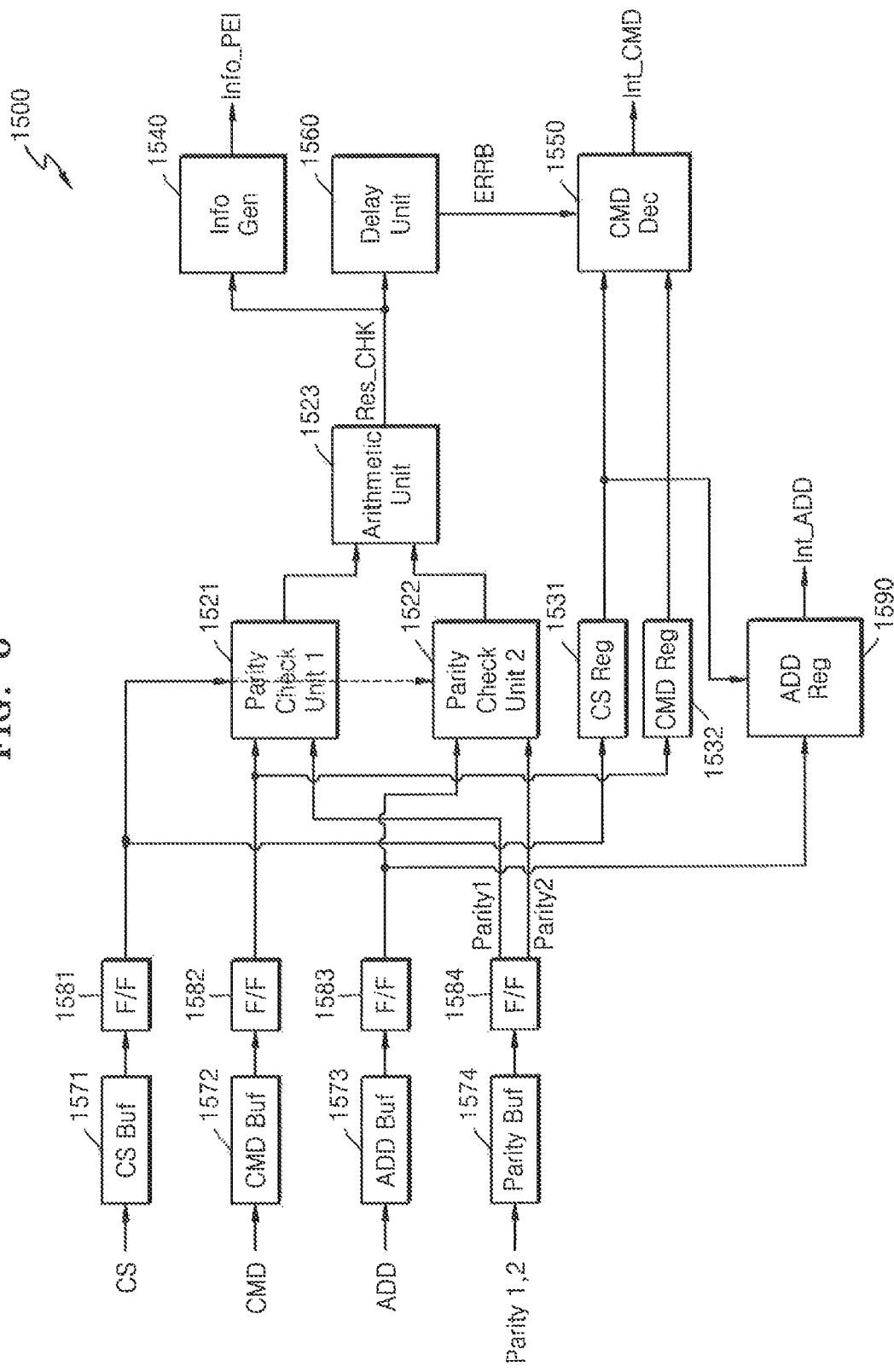
FIG. 6 is a block diagram illustrating a semiconductor memory device according to another embodiment of the inventive concept.

FIG. 6 is a block diagram illustrating a semiconductor memory device 1500 according to another embodiment of the inventive concept. In FIG. 6, a parity check operation with respect to a command CMD and an address ADD from a memory controller is illustrated.

As illustrated in FIG. 6, the semiconductor memory device 1500 may include first and second parity check units 1521 and 1522, an arithmetic operation unit 1523, at least one register 1531 and 1532, an information generator 1540, a command decoder 1550, a delay unit 1560, at least one, first through fourth buffers 1571, 1572, 1573, and 1574, and at least one, first through fourth flip flops 1581, 1582, 1583, and 1584, and an address register 1590. Elements illustrated in FIG. 6 that are identical or similar to those described above with reference to the previous embodiments operate in the same or similar manner.

The fourth buffer 1574 receives at least one parity signal from the memory controller, for example, a first parity signal parity1 and a second parity signal parity2, and stores the same. For example, the first parity signal parity1 may be a signal for a parity check with respect to a command CMD, and the second parity signal parity2 may be a signal for a parity check with respect to an address ADD. Also, while a parity check operation with respect to an address ADD is illustrated in FIG. 6, as in the above-described embodiments, if a plurality of banks are included in the semiconductor memory device 1500 and a bank group concept is applied thereto, the address ADD may further include a bank address and a bank group address.

A command CMD from the second flip flop 1582 and a first parity signal parity1 from the fourth flip flop 1582 may be provided to the first parity check unit 1521. The first parity check unit 1521 generates a first parity check result by using a command CMD and a first parity signal parity1. As in the above-described embodiments, a first parity check result may be generated by determining bit values of bits constituting a command CMD and a bit value of a parity signal Parity.

Also, an address from the third flip flop 1583 and a second parity signal parity2 from the fourth flip flop 1582 may be provided to the second parity check unit 1522. The second parity check unit 1522 generates a second parity check result by using an address ADD and a second parity signal parity2. As in the above-described embodiments, a second parity check result may be generated by determining bit values of bits constituting an address ADD and a bit value of a parity signal Parity.

The first and second parity check results may be provided to the arithmetic operation unit 1523 (Hereafter, the arithmetic operation unit is referred as an operation unit). The operation unit 1523 outputs a parity check result Res_CHK indicating whether an error occurred in at least one of a command CMD and an address ADD by calculating the first and second parity check results. If an error occurred in at least one of a command CMD and an address ADD, generation of an internal command Int_CMD may have to be blocked, but if no error is generated in both the command CMD and the address ADD, a memory operation may be performed according to an internal command Int_CMD. Accordingly, if no error occurred in both the command CMD and the address ADD, the operation unit 1523 outputs a parity check result Res_CHK indicating that a parity error is not generated, and if a parity error is generated in at least one of the command CMD and the address ADD, the operation unit 1523 outputs a parity check result Res_CHK indicating that a parity error is generated. Parity error information Info_PEI is generated according to the parity check result Res_CHK from the operation unit 1523. Also, the parity check result Res_CHK is provided to the delay unit 1560, and a parity check result ERRB from the delay unit 1560 is provided to the command decoder 1550.

According to the current embodiment of the inventive concept, even if errors occurred in both the command CMD and the address ADD, a normal parity check result may be correctly indicated. For example, a separate parity signal may be provided for each of a command CMD and an address ADD, and separate parity check operations may be performed.

Figure 7:
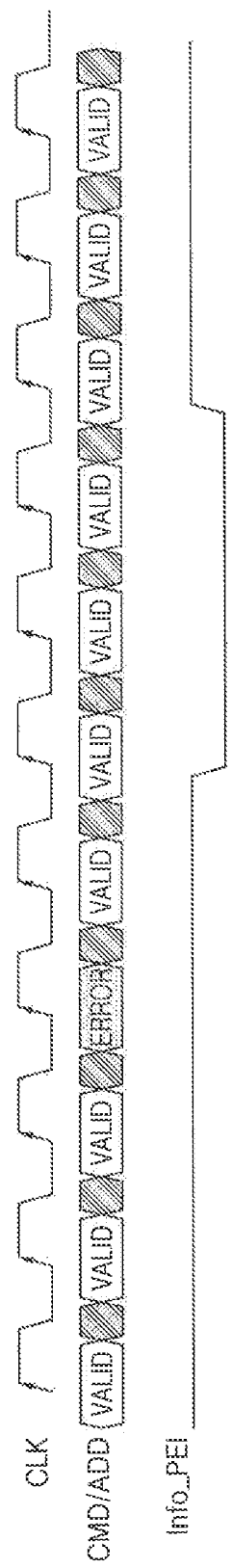
FIG. 7 is a timing diagram illustrating a parity check operation according to an embodiment of the inventive concept.

FIG. 7 is a timing diagram illustrating a parity check operation according to an embodiment of the inventive concept.

As illustrated in FIG. 7, a clock signal CLK and a command/address CMD/ADD are output from a memory controller, and a semiconductor memory device receives a command/address CMD/ADD in synchronization with a clock signal CLK. For example, the semiconductor memory device may receive a command/address CMD/ADD in synchronization with a rising edge of a clock signal CLK, and perform a parity check operation by using the received command/address CMD/ADD and a parity signal (not shown) accompanying the received command/address.

As shown, in performing a parity check operation with respect to the command/address CMD/ADD received in synchronization with a clock signal CLK, a parity error is found in a fourth command/address CMD/ADD. In consideration of a time needed for the parity check operation, parity error information Info_PEI indicating that a parity error is generated may be provided to the memory controller after two clock cycles. If a parity error is generated, parity error information Info_PEI may have a level corresponding to a logic low, and the parity error information Info_PEI maintains a logic low level during a predetermined section. For example, as illustrated in FIG. 7, the logic low level may be maintained for three clock cycles.

The memory controller may receive parity error information Info_PEI and analyze the same to detect a command/address CMD/ADD in which an error is generated. For example, at a time when the parity error information Info_PEI is changed to a low level, it may be determined that a parity error is generated in the command/address CMD/ADD that was output two clock cycles before.

Figure 8:
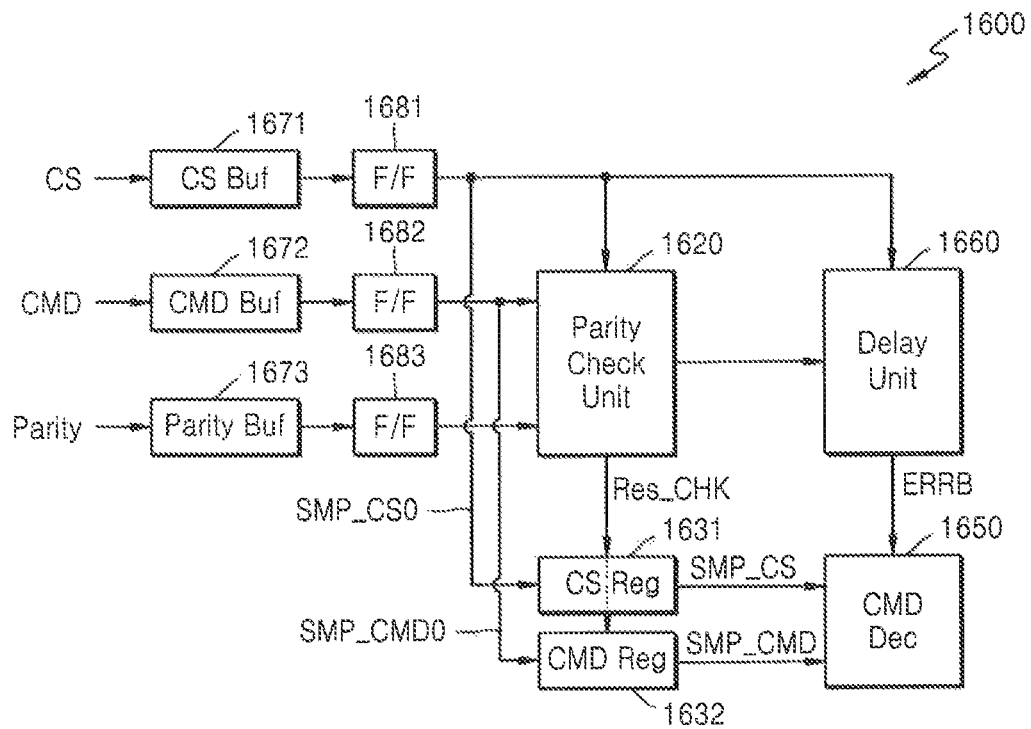
FIG. 8 is a block diagram illustrating a semiconductor memory device according to another embodiment of the inventive concept.

FIG. 8 is a block diagram illustrating a semiconductor memory device 1600 according to another embodiment of the inventive concept. The semiconductor memory device 1600 may include a parity check unit 1620, at least one register 1631 and 1632, a command decoder 1650, a delay unit 1660, at least one buffer 1671, 1672, and 1673, and at least one flip flop 1681, 1682, and 1683. A parity check operation with respect to a command CMD is illustrated in the current embodiment of the inventive concept.

A command CMD passes through the second buffer 1672 and the second flip flop 1682 to be provided to the parity check unit 1620. Also, a parity signal passes through the third buffer 1673 and the third flip flop 1683 and is provided to the parity check unit 1620. The parity check unit 1620 performs a parity check operation with respect to a command CMD in response to a chip select signal CS that is provided after passing through the first buffer 1671 and the first flip flop 1681.

Also, a chip select signal CS from the first flip flop 1681 is stored in the chip select register 1631, and a command CMD from the second flip flop 1682 is stored in the command register 1632. A parity check result Res_CHK from the parity check unit 1620 passes through the delay unit 1660 and is provided to the command decoder 1650. If no parity error is generated, a chip select signal CS and a command CMD are provided to the command decoder 1650 in synchronization with the parity check result Res_CHK provided to the command decoder 1650, and an internal command is output from the command decoder 1650. On the other hand, if a parity error is generated, output of an internal command from the command decoder 1650 is blocked.

A parity check operation of the parity check unit 1620 or a signal delaying operation of the delay unit 1660 may be performed in response to a chip select signal CS. For example, if a chip select signal CS is inactivated, the semiconductor memory device 1600 does not perform a normal memory operation, and accordingly, a parity check operation or a signal delaying operation may be disabled. On the other hand, if a chip select signal CS is activated, the parity check unit 1620 may perform a parity check operation by using a command CMD and a parity signal Parity, and the delay unit 1660 may receive a parity check result Res_CHK from the parity check unit 1620 and delay and output the same.

Also, if a parity error is generated, generation of an internal command may be prevented by blocking a signal provided to the command decoder 1650. For example, a parity check result Res_CHK may be provided to at least one of the chip select signal register 1631 and the command register 1632, and the chip select signal register 1631 and the command register 1632 may control a signal output operation by responding to the parity check result Res_CHK. For example, provision of both a chip select signal CS and a command CMD to the command decoder 1650 may be blocked. Alternatively, according to another embodiment of the inventive concept, if a chip select signal CS is not activated, the command decoder 1650 may be disabled from putting an internal command, and in this embodiment, a chip select signal CS may not be provided to the command decoder 1650.

The first flip flop 1681 receives a chip select signal CS and synchronizes the same with an internal clock signal and outputs the same, and a signal that is output by using the first flip flop 1681 may be referred to as a first chip select signal SMP_CS0. Also, the chip select signal register 1631 receives a first chip select signal SMP_CS0 and delays and outputs the same, and a signal output by using the first flip flop 1681 may be referred to as a second chip select signal SMP_CS. The first chip select signal SMP_CS0 or the second chip select signal SMP_CS may each be generated by delaying a chip select signal CS, and thus, the first chip select signal SMP_CS0 or the second chip select signal SMP_CS may each be referred to as a chip select signal. Similarly, a first command SMP_CMD0 and a second command SMP_CMD may also each be referred to as a command.

Figure 9:
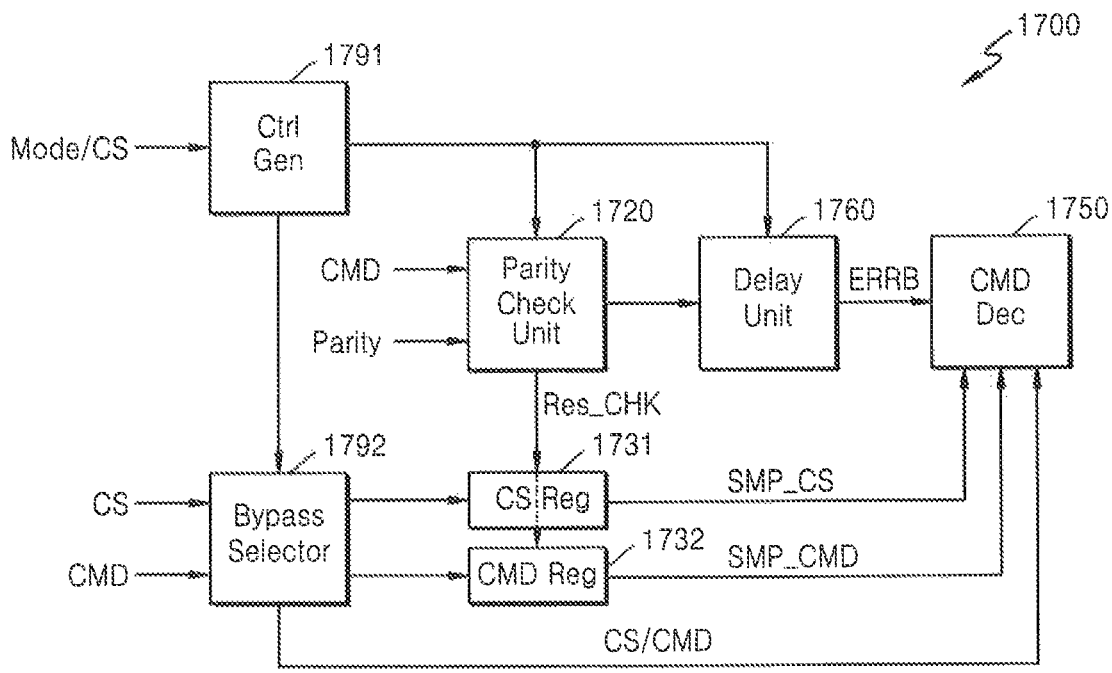
FIG. 9 is a block diagram illustrating a semiconductor memory device according to another embodiment of the inventive concept.

FIG. 9 is a block diagram a semiconductor memory device 1700 according to another embodiment of the inventive concept. The semiconductor memory device 1700 may include a parity check unit 1720, at least one register 1731 and 1732, a command decoder 1750, a delay unit 1760, a control signal generator 1791, and a bypass selecting unit 1792. For convenience of description, buffers or flip flops that are illustrated with reference to the above embodiments are omitted. A parity check operation performed with respect to a command CMD is illustrated in the current embodiment of the inventive concept.

The parity check unit 1720 receives a command CMD and a parity signal Parity and performs a parity check operation with respect to the command CMD. Also, a parity check result Res_CHK passes through the delay unit 1760 to be provided to the command decoder 1750. In addition, the parity check result Res_CHK may be provided to at least one of the chip select signal register 1731 and the command register 1732, and the chip select signal register 1731 and the command register 1732 may control an operation of outputting a signal in response to the parity check result Res_CHK.

The semiconductor memory device 1700 may selectively perform a parity check operation according to a set mode. For example, a mode register set (MRS, not shown) may be included in the semiconductor memory device 1700, and a parity check operation may be set to be performed according to a mode signal Mode sent from the MRS during an initial operation of the semiconductor memory device 1700.

The control signal generator 1791 generates a control signal according to a mode signal Mode. For example, if a parity check operation is set to be performed, the control signal generator 1791 enables or disables the parity check unit 1720 and the delay unit 1760 according to whether a chip select signal CS is activated or not. For example, when a chip select signal CS is activated, the parity check unit 1720 performs a parity check operation with respect to a command CMD, and the delay unit 1760 delays the parity check result Res_CHK and outputs the same. On the other hand, when a chip select signal CS is inactivated, the parity check unit 1720 and the delay unit 1760 are disabled. Also, when a parity check operation is set to be performed, the bypass selecting unit 1792 provides a chip select signal CS and a command CMD to the chip select signal register 1731 and the command register 1732.

Meanwhile, when a parity check operation is set not to be performed, the parity check unit 1720 and the delay unit 1760 are disabled according to a control from the control signal generator 1791. Also, the bypass select unit 1792 provides a chip select signal CS and a command CMD directly to the command decoder 1750 according to a control of the control signal generator 1791, without going through the chip select register 1731 and the command register 1732. According to the above-described operation, if a parity check operation is set not to be performed, a chip select signal CS and a command CMD or the like may be directly provided to the command decoder 1750 without latency for a parity check. On the other hand, if a parity check operation is performed, a chip select signal SMP_CS and a command SMP_CMD that are delayed a predetermined number of clock cycles may be provided to the command decoder 1750.

Figure 10B:
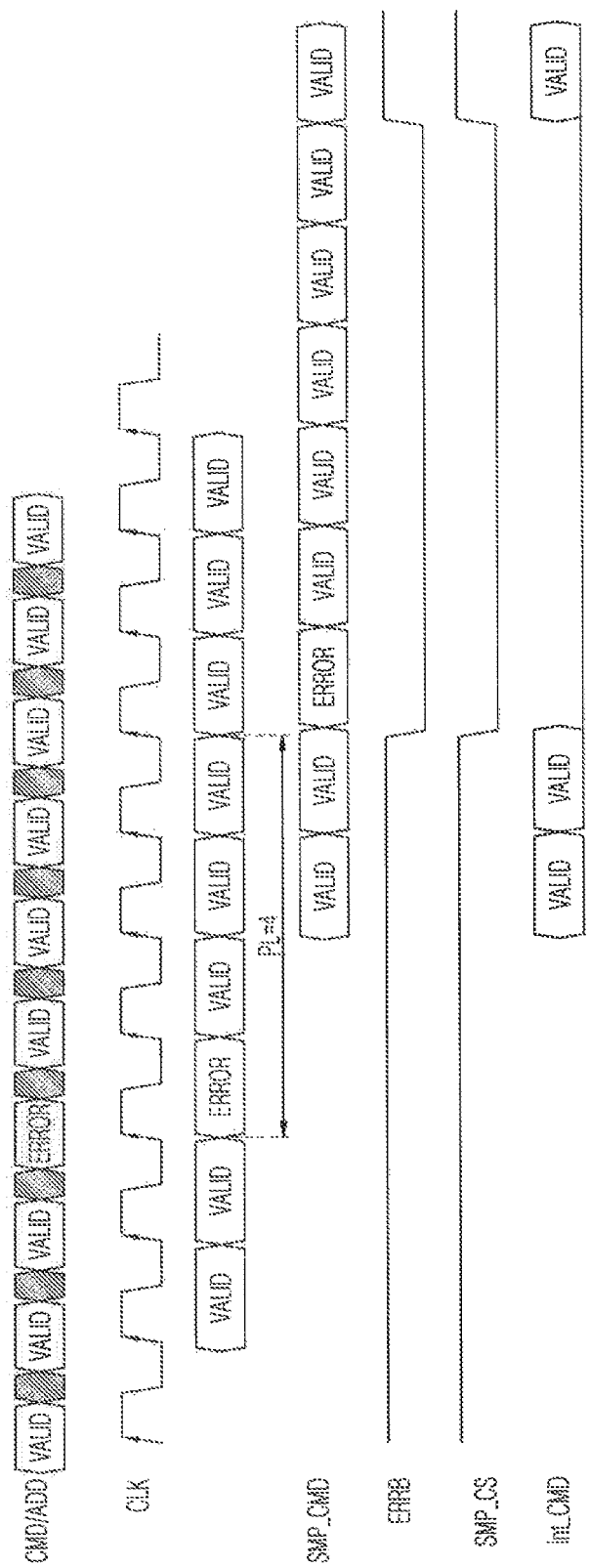

FIGS. 10A, 10B, and 11 are timing diagrams of a parity check operation according to an embodiment of the inventive concept. A command/address CMD/ADD is received in synchronization with a clock signal CLK, and a parity check operation is performed with respect to the received command/address CMD/ADD.

FIG. 10A and FIG. 10B show a command/address CMD/ADD in synchronization with a clock signal CLK, and a parity error detected using a parity check operation.

As a parity error is detected, a parity check result (or a signal ERRB obtained by delaying the parity check result) may be changed to a logic low state. A logic low state of the parity check result ERRB may be maintained for a predetermined section, and for a predetermined number of clocks cycles (e.g., three or six clock cycles) as in the above-described embodiment of the inventive concept. As the parity check result ERRB is changed to a logic low, an operation of generating an internal command of a command decoder may be blocked. For example, as the parity check result ERRB is provided to a chip select signal register, provision of a chip select signal SMP_CS provided from the chip select signal register to the command decoder may be blocked. When the parity check result ERRB is in a logic low state, generation of an internal command output from the command decoder CMDDEC_Output may be blocked.

As shown in FIG. 10B, after a predetermined time, the parity check result ERRB is changed to a logic high again. For example, ERRB is held low until a new command/address CMD/ADD (e.g. int_CMD) is received again from the memory controller, FIG. 11 shows a timing diagram according to an embodiment of the present invention. As illustrated in FIG. 11, to block a command having a parity error from going to a command decoder, a parity check result ERRB may have a logic low state, until the arrival of a next command or address. That is, a semiconductor memory device generates an internal command according to a command CMD sent from the memory controller but blocks generation of an internal command with respect to a command CMD having a parity error.

If no parity error is generated in the command, the semiconductor memory device may perform an operation of generating an internal command with respect to the command and a memory operation according to the generated internal command and output a result thereof to the memory controller.

Figure 12:
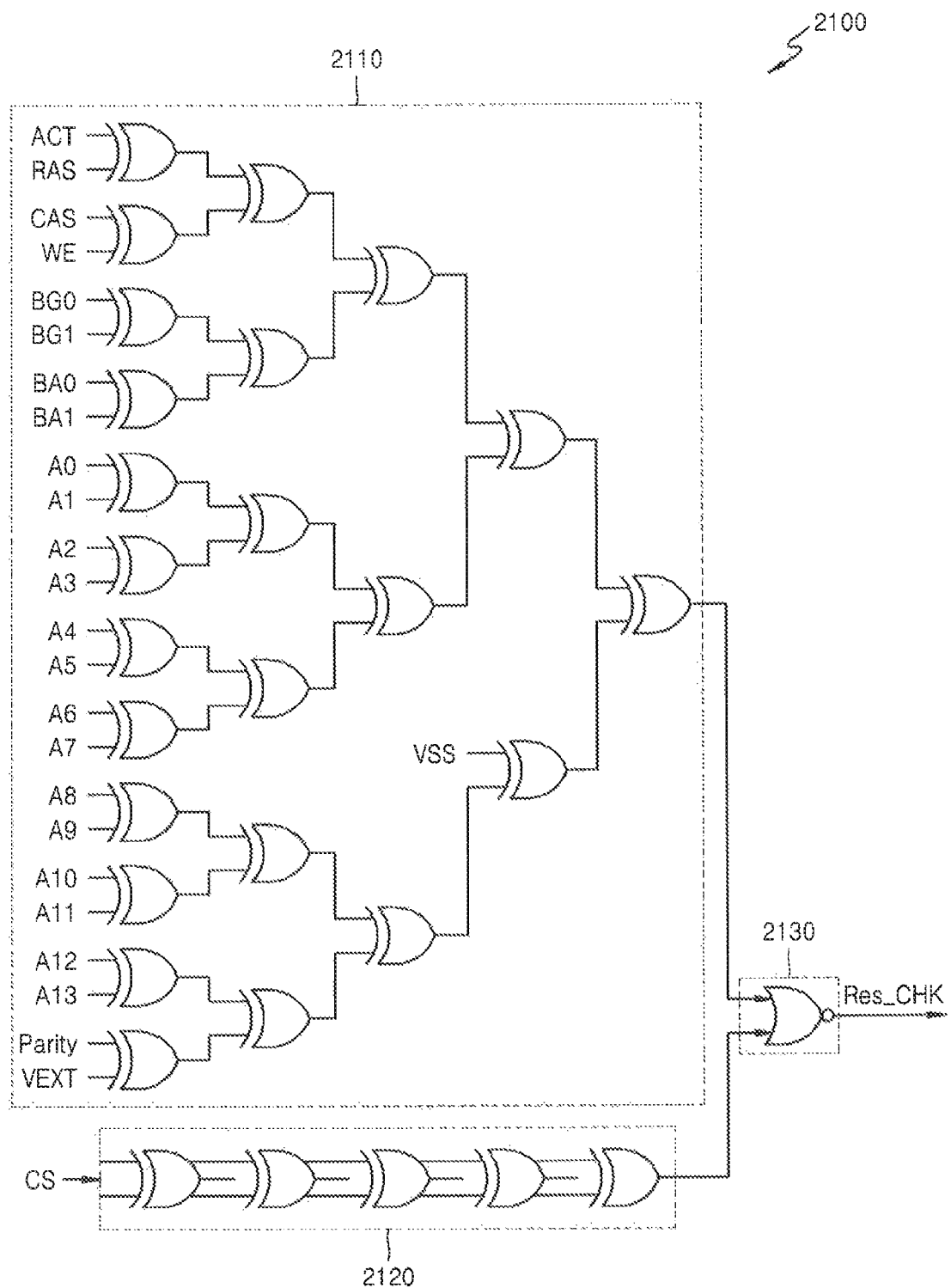
FIG. 12 is a circuit diagram illustrating a parity check unit included in a semiconductor memory device according to an embodiment of the inventive concept.

FIG. 12 is a circuit diagram illustrating a parity check unit 2100 included in a semiconductor memory device according to an embodiment of the inventive concept. In FIG. 12, a parity check operation is performed with respect to a command and an address.

As illustrated in FIG. 12, the parity check unit 2100 may include a parity operation unit 2110, a delay unit 2120, and a parity check result output unit 2130. The parity operation unit 2110, the delay unit 2120, and the parity check result outputting unit 2130 may each include at least one logic device. For example, the parity operation unit 2110 and the delay unit 2120 each including a plurality of XOR operators and the parity check result output unit 2130 including a NOR operator are illustrated in FIG. 12.

The parity operation unit 2110 may receive a command and an address and perform an operation by using a plurality of XOR operators and then output operation results thereof. Various signals (e.g., ACT, RAS, CAS, and WE) including commands are provided to the parity operation unit 2110, and a plurality of address bits A0 through A13 constituting an address are provided to the parity operation unit 2110. Also, a bank address BA0 or BA1 and a bank group address BF0 or BG1 may be further provided to the parity operation unit 2110. Also, a parity signal may be further provided to the parity operation unit 2110, and a voltage signal VEXT or VSS for providing a signal at a predetermined level may be further provided to the parity operation unit 2110.

For example, a command, an address, a bank address, a bank group address and a parity signal may include 23 bits, and the parity operation unit 2110 may output a result of determining whether the number of bits having a logic high bit value from among the 23 bits is an even number. The parity operation unit 2110 outputs a signal having a first status if the number of bits having logic high bit values is an even number; and if the number of bits having logic high bit values is an odd number, the parity operation unit 2110 may output a signal having a second status. The memory controller outputs a parity signal Parity by adjusting a level of the parity signal Parity such that the number of bits having logic high bit values from among the 23 bits is an even number, and accordingly, if no parity error is generated, the parity operation unit 2110 may output a signal having a first status, and if a parity error is generated, the parity operation unit 2110 may output a signal having a second status.

The delay unit 2120 receives a chip select signal CS and delays and outputs the same. For example, the delay unit 2120 may delay a chip select signal CS and output the same in consideration of a time needed for a parity check. For example, if the parity operation unit 2110 performs an XOR operation in five stages, the delay unit 2120 may include five, serially-connected, XOR operators.

Meanwhile, the parity check result output unit 2130 may receive an operation result from the parity operation unit 2120 and a delayed chip select signal CS sent from the delay unit 2120, and output a result of a NOR operation as a parity check result Res_CHK. The parity check result output unit 2130 outputs a parity check result Res_CHK corresponding to an operation result sent from the parity operation unit 2110 when the chip select signal CS is activated. On the other hand, when the chip select signal CS is inactivated, the parity check result output unit 2130 outputs a parity check result Res_CHK having a constant level regardless of an operation result sent from the parity operation unit 2110.

Figure 13A:
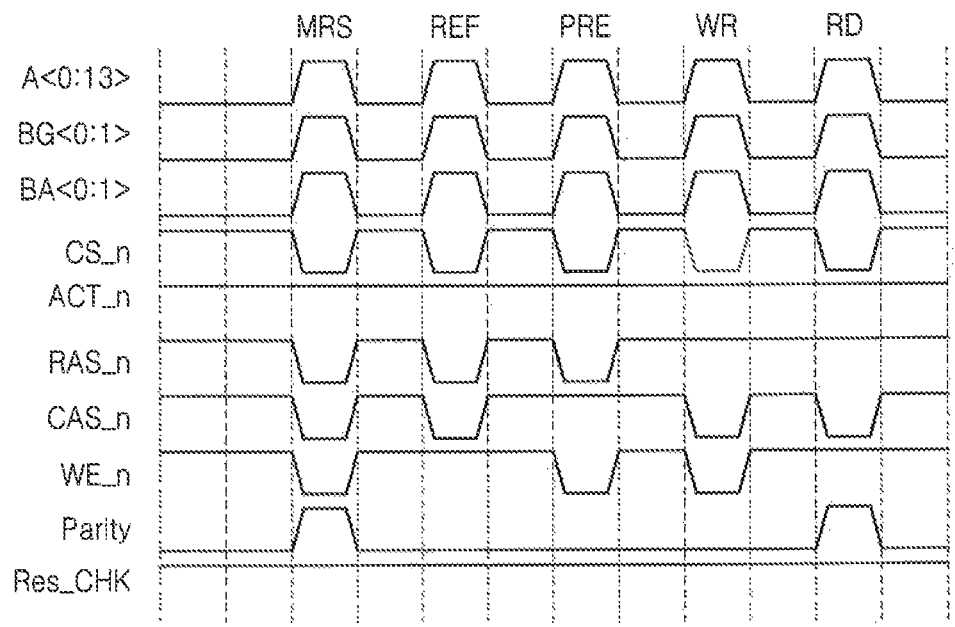
FIGS. 13A and 13B are timing diagrams according to an operation of the parity check unit of FIG. 12 according to an embodiment of the inventive concept.
Figure 13B:
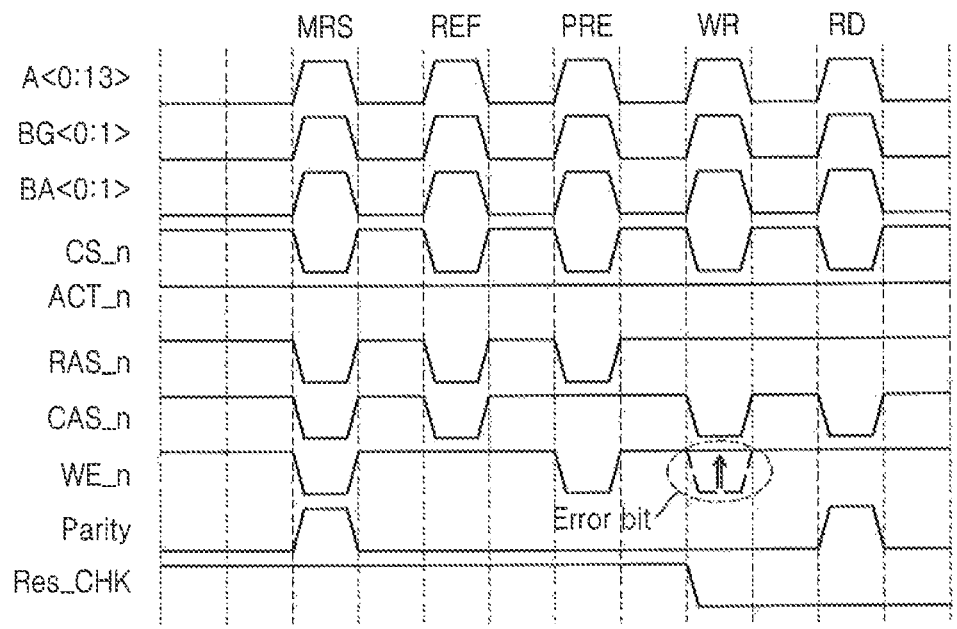

FIGS. 13A and 13B are timing diagrams in connection with operation of a parity check unit 2100 of FIG. 12 according to an embodiment of the inventive concept. FIG. 13A illustrates an example in which no parity error is generated, and FIG. 13B illustrates an example in which a parity error is generated. Also, for convenience of description, address bits A<0:13>, BG<0:1>, and BA<0:1> are all assumed to have a logic high value.

A command may be formed of a combination of various signals. For example, a command may include ACT_n, RAS_n, CAS_n, WE_n, or the like. In FIG. 13A, a chip select signal CS_n is further illustrated, and the chip select signal CS_n may be described as being included in the command. It is assumed that a bit value of a parity signal Parity is set such that the number of bits having a logic high value, from among the address bits A<0:13>, BG<0:1>, and BA<0:1>, command bits CS_n, ACT_n, RAS_n, CAS_n, and WE_n, and bits of the parity signal Parity, is an even number.

As shown in FIG. 13A, as the address bits A<0:13>, BG<0:1>, BA<0:1> and the command bits CS_n, ACT_n, RAS_n, CAS_n, WE_n are received without error, no parity error is generated. For example, a command provided to the semiconductor memory device may have a signal combination in various forms, and may have various signal combinations with respect to an MRS command MRS, a refresh command REF, a precharge command PRE, a write command WR, or a read command RD, etc. As no parity signal is generated with respect to the above commands, a parity check result Res_CHK may maintain a first level (e.g., a logic high level).

As shown in FIG. 13B, if a signal is incorrectly received in regard to a command receiving operation, a parity error may be generated. For example, when a write command WR is received, even though a write enable signal WE_n having a logic low state is provided from the memory controller, the semiconductor memory device may incorrectly receive the write enable signal WE_n so that the write enable signal WE_n has a logic high value.

Figure 14:
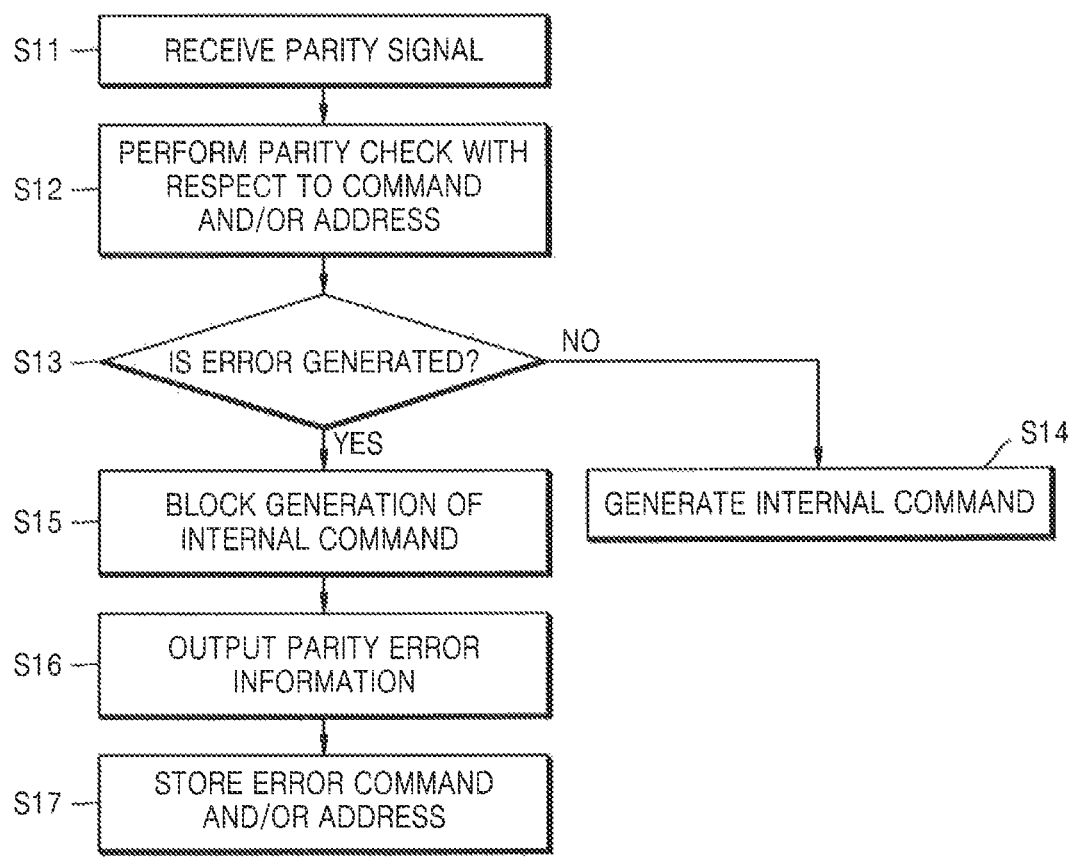
FIG. 14 illustrates steps of a method of operating a semiconductor memory device according to an embodiment of the inventive concept.

Here, the number of bits having a logic high value from among bits that constitute the write command WR, the parity signal Parity, and address bits A<0:13>, BG<0:1>, and BA<0:1> may be an odd number, and this may be detected as a parity error being generated. Accordingly, a parity check result Res_CHK may be changed to a second level (e.g., a logic low level), FIG. 14 shows steps of a method of operating a semiconductor memory device according to an embodiment of the inventive concept.

The semiconductor memory device may receive various signals for a memory operation from a memory controller, for example, a command and an address. Also, a signal may be received from the memory controller to conduct a parity check with respect to a command and/or an address, in operation S11. A parity signal is provided by the memory controller as a predetermined value according to bit values of a command and/or an address. For example, when a parity check is performed with respect to a command and an address, bit values of the parity signal may be determined such that the number of bits having a logic high from among bits constituting the command, the address, and the parity signal is an even number.

In operation S12, a parity check operation with respect to a command and/or an address is performed by using the received parity signal. A parity check may be performed by detecting bit values of bits constituting the command, the address, and the parity signal, and whether a parity error is generated is determined based on the parity check in operation S13. As a result of the determination, if no parity is generated, the command is decoded to generate an internal command, and a memory operation is performed according to the generated internal command. As in the above-described embodiments, a parity check result may be provided as a result of performing a parity check, to a command decoder after a predetermined delay operation is performed, and the command is provided to the command decoder in synchronization with the parity check result provided to the command decoder, the command may be delayed a predetermined number of clock cycles by using a register and output to the command decoder.

On the other hand, if a parity error is generated, generation of an internal command is blocked in operation S15. To block generation of an internal command, a decoding operation of the command decoder may be disabled as a parity check result is provided to the command decoder, or as a parity check result is provided to a predetermined register, provision of a command to the command decoder may be blocked. Also, a chip select signal may be provided to the command decoder together with a command (not shown), and as a parity check result is provided to a register that stores a chip select signal, provision of a chip select signal to the command decoder may be blocked.

Meanwhile, if a parity error is generated, information indicating that the parity error is generated may have to be output to the memory controller, and parity error information may be generated according to a parity check result and output to the memory controller in operation S16. Also, in operation S17, a command and/or an address in which a parity error is generated may be stored according to the parity check result, and for example, a multi purpose register (MPR) may be included in the semiconductor memory device and the command and/or the address in which a parity error is generated may be stored in the MPR. Information stored in the MPR may be provided to the memory controller.

Figure 15:
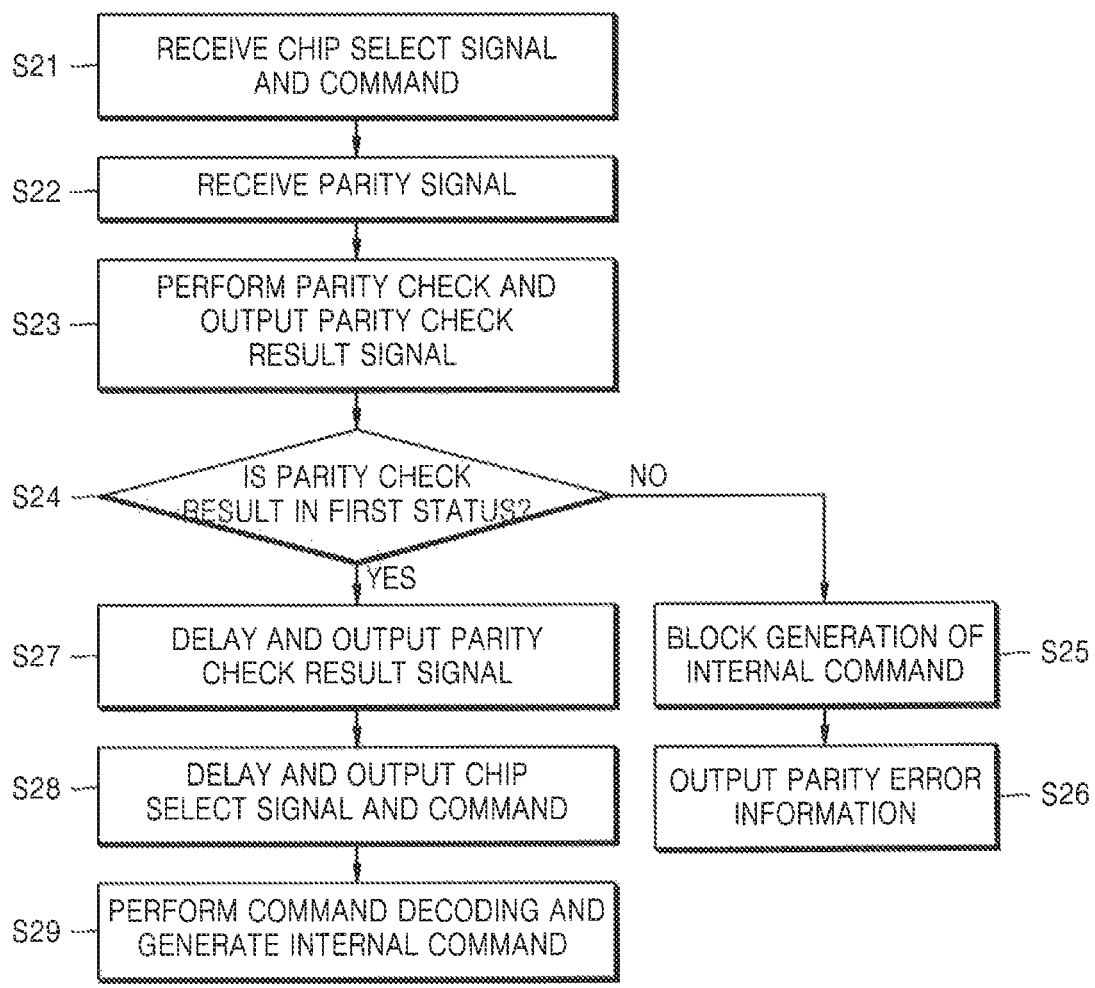
FIG. 15 illustrates steps of a method of operating a semiconductor memory device according to another embodiment of the inventive concept.

FIG. 15 shows steps of a method of operating a semiconductor memory device according to another embodiment of the inventive concept. A parity check is conducted with respect to a command in FIG. 15.

In operation S21, a chip select signal and a command are received from a memory controller, and in operation S22, a parity signal is received from the memory controller for a parity check with respect to the command. In operation S23, a parity check operation is performed by using the received command and the received parity signal, and also, a parity check result signal is output.

If no parity error is generated, a parity check result signal may have a first status, and, on the other hand, if a parity error is generated, a parity check result signal may have a second status. Whether the parity check result signal has a first status or not is determined in operation S24, and when the parity check result signal has the first status as no parity error is generated, the parity check result signal is delayed a predetermined number of clock cycles and provided to the command decoder in operation S27. In addition, a chip select signal and a command are provided to the command decoder in synchronization with the parity check result signal provided to the command decoder, the chip select signal and the command may be respectively stored in registers, and thus may be delayed a predetermined number of clock cycles and provided to the command decoder in operation S28. The command decoder performs a decoding operation by using the received chip select signal and the received command, and generates an internal command and outputs the same in operation S29.

Figure 16:
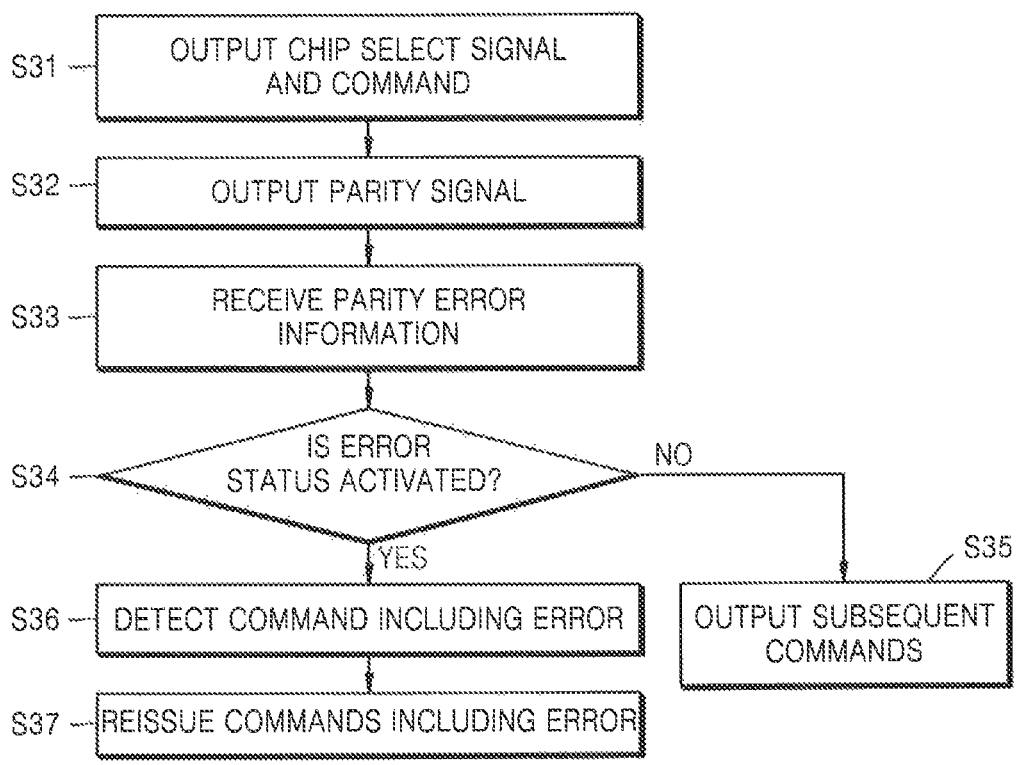
FIG. 16 illustrates steps of a method of operating a memory controller according to an embodiment of the inventive concept.

If a parity check result signal has a second status as a parity error is generated, generation of an internal command is blocked in operation S25. As in the above-described embodiment, output of an internal command may be prevented by blocking provision of a chip select signal or a command to the command decoder or blocking an input of a signal in the command decoder. Also, parity error information indicating that a parity error is generated may be generated and output to the memory controller in operation S26, FIG. 16 is a flowchart illustrating a method of operating a memory controller according to an embodiment of the inventive concept.

The memory controller outputs a chip select signal and a command to the semiconductor device to request a memory operation in operation S31. Also, the memory controller generates a parity signal for a parity check and outputs the same to the semiconductor memory device in operation S32. The parity signal may have a level according to bit values of a command for example, a bit value of a parity signal may be set such that the number of bits corresponding to a logic high from a command and a parity signal is an even number or an odd number.

A parity check operation is performed in the semiconductor memory device. When a parity error is generated, parity error information indicating the parity error is received by the memory controller in operation S33. As a status of parity error information is detected, whether an error status is activated or not is determined in operation S34, and if no parity error is generated, the memory controller performs a normal operation of outputting subsequent commands in operation S35.

Figure 17:
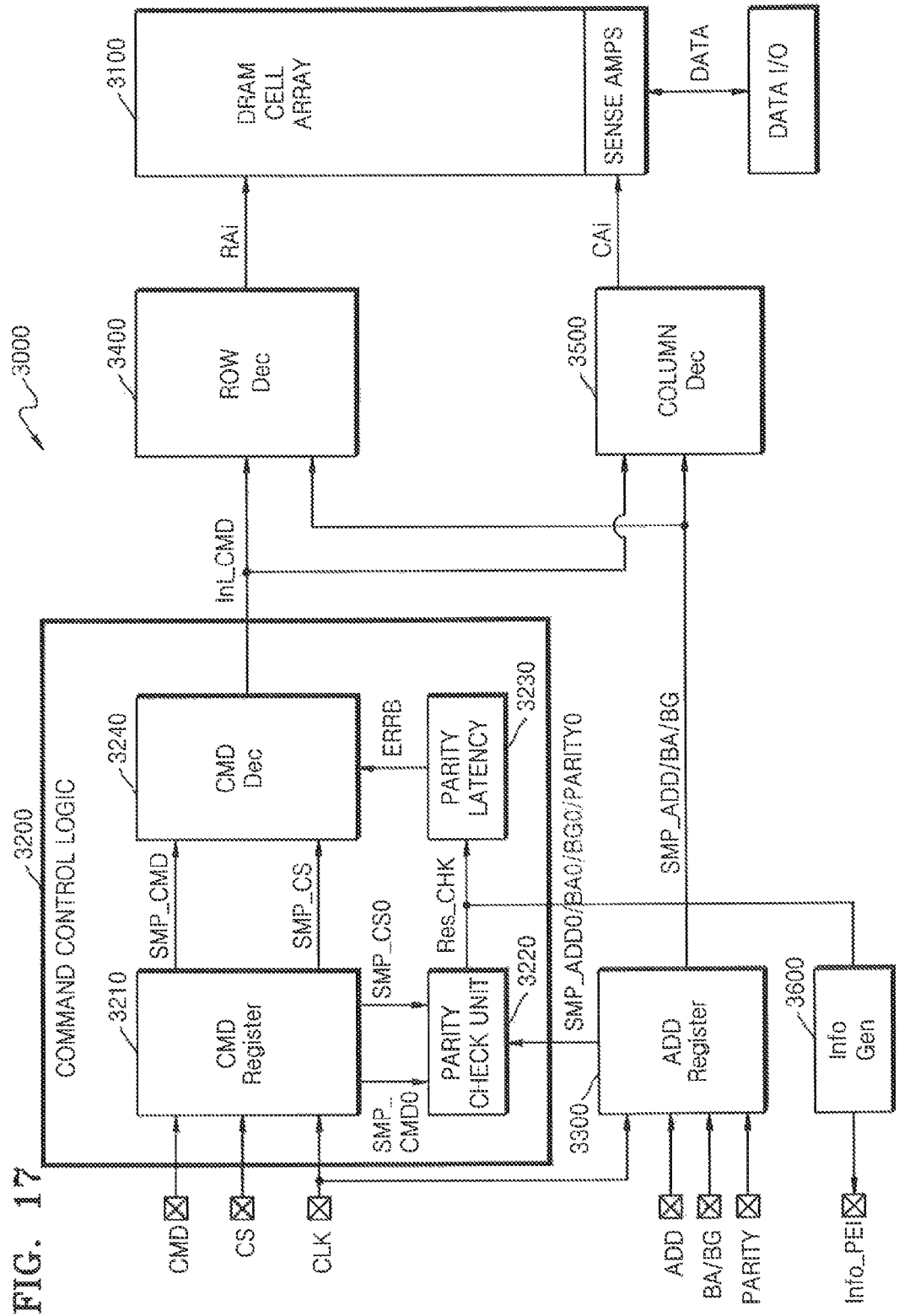
FIG. 17 is a block diagram of a semiconductor memory device according to another embodiment of the inventive concept.

If a parity error is generated, the memory controller detects commands having an error and when the parity error information is received, in operation S36. For example, the memory controller may temporarily store commands that are output to the semiconductor memory device, and may detect commands having an error in consideration of time needed for a parity check of the semiconductor memory device. For example, when parity error information regarding the command is received two clock cycles after the memory controller has output the command, the memory controller may detect that an error is generated in the command that is output two clock cycles before receiving the parity error information. In operation S37, the memory controller reissues the command having an error to the semiconductor memory device a predetermined time after detecting the parity error. Accordingly, a memory operation in the semiconductor memory device using a command having an error is prevented, FIG. 17 is a block diagram illustrating a semiconductor memory device according to another embodiment of the inventive concept. In FIG. 17, a dynamic random access memory (DRAM) 3000 is illustrated as a semiconductor memory device performing a parity check operation described with reference to the above embodiments of the inventive concept.

As illustrated in FIG. 17, the DRAM 3000 includes a DRAM cell array 3100, a command control logic unit 3200, an address register 3300, a row decoder 3400, a column decoder 3500, and an information generator 3600. Also, the command control logic unit 3200 includes a command register 3210, a parity check unit 3220, a parity latency 3230, and a command decoder 3240.

The command control logic unit 3200 may perform the parity check operation described above. For example, the command control logic unit 3200 may receive a command CMD, a chip select signal CS, and a clock signal CLK. The command CMD and the chip select signal CS may be stored in the command register 3210 in synchronization with the clock signal CLK. A buffer, a flip flop, and shift registers (each not shown) may be included in the command register 3210, and while a register that stores a chip select signal CS is additionally illustrated in the above embodiments, the command register 3210 may also store a chip select signal CS and a command CMD as illustrated in FIG. 17.

A first command SMP_CMD0 and a first chip select signal SMP_CS0 may output from a flip flop included in the command register 3210, and when assuming a second command SMP_CMD and a second chip select signal SMP_CS, respectively, as signals obtained by delaying the first command SMP_CMD0 and the first chip select signal SMP_CS0 by using a shift register. The parity check unit 3220 may perform a parity check operation in response to the first chip select signal SMP_CMD0.

A first address SMP_ADD0/BA0/BG0 output from the address register 3300 a first parity signal SMP_Parity0, and a first command SMP_CMD0, may be provided to the parity check unit 3220 for performing a parity check on a command CMD and an address ADD/BA/BG. A parity signal Parity0 may be stored in an additional register is illustrated in the above-described embodiments, or may be transmitted via the address register 3300, as illustrated in FIG. 17.

A parity check result Res_CHK is provided to the parity latency 3230, and the parity latency 3230 delays the received parity check result Res_CHK and provides the delayed parity check result ERRB to the command decoder 3240. Accordingly, the delayed parity check result ERRB is provided to the command decoder 3240 in synchronization with the second command SMP_CMD and the second chip select signal SMP_CS. The command decoder 3240 decoding an internal command Int_CMD and outputs a decoded command.

The internal command Int_CMD may be provided to the row decoder 3400 and the column decoder 3500 and a row address RAi and a column address CAi may be generated according to an internal address SMP_ADD/BA/BG. For example, a memory operation such as writing or reading data to and from the DRAM cell array 3100 may be performed according to the internal command Int_CMD according to the decoded row address RAi and column address CAi. The internal address SMP_ADD/BA/BG may be a delayed first address SMP_ADD0/BA0/BG0 and output by the address register 3300.

Also, the information generator 3600 may receive a parity check result Res_CHK and generate, according to the parity check result Res_CHK, parity error information Info_PEI indicating whether a parity error is generated or not and output the same.

FIGS. 18A, 18B, 18C, 18B, and 18E are circuit diagrams illustrating elements included in the semiconductor memory device of FIG. 17 according to embodiments of the inventive concept.

The command register 3210 may include a flip flop 3211 and a shift register 3212, and may further include a buffer (not shown) that converts a signal at an external TTL level to a signal at a CMOS. The flip flop 3211 receives a command CMD in synchronization with a clock signal CLK, and outputs a first command SMP_CMD0 in synchronization with a clock signal CLK.

The shift register 3212 may include at least one flip flop and at least one inverter. The shift register 3212 receives a first command SMP_CMD0 and delays the same for a predetermined number of clock cycles to output a second command SMP_CMD. The number of flip flops included in the shift register 3212 may be adjusted according to the number of delayed clock cycles.

Figure 18A:
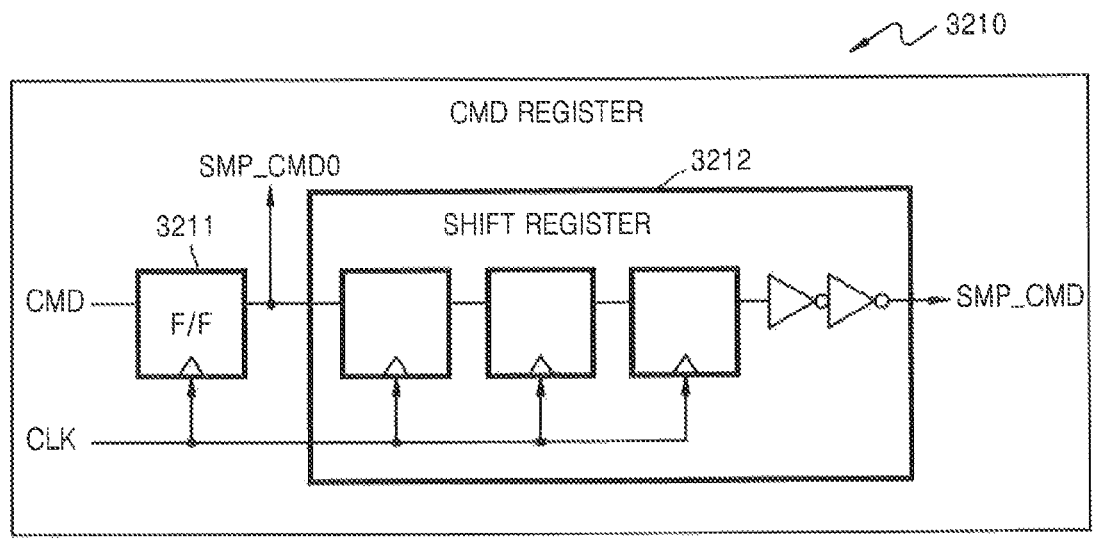
FIGS. 18A, 18B, 18C, 18D, and 18E are circuit diagrams of components included in the semiconductor memory device of FIG. 17 according to an embodiment of the inventive concept.
Figure 18B:
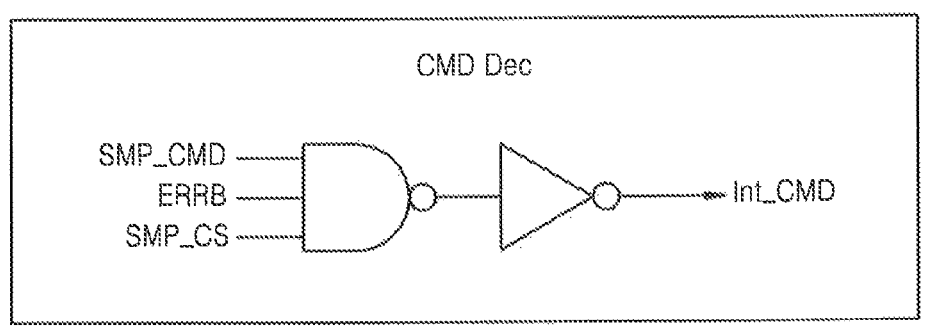
Figure 18C:
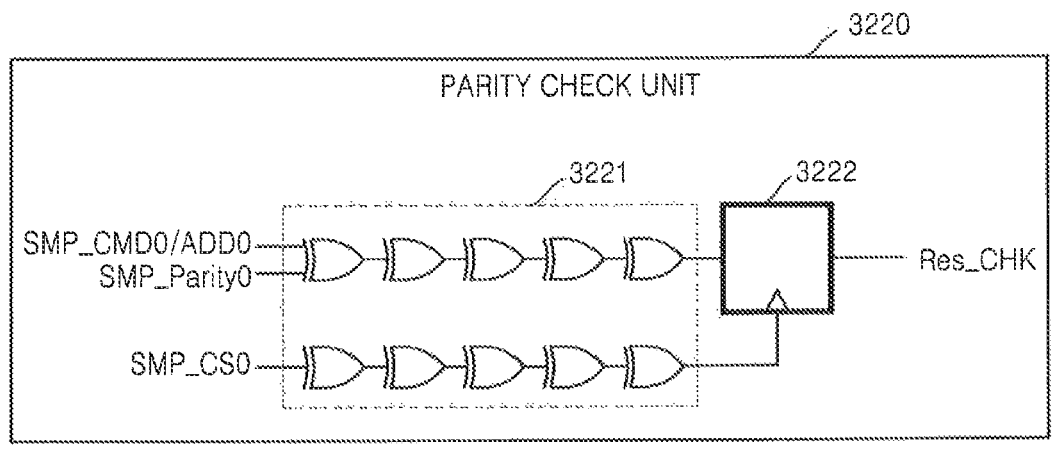

Meanwhile, as illustrated in FIG. 18B, commands input to the command decoder 3240 may be logic-operated and an operation result thereof may be output as an internal command Int_CMD. For a NAND operator logic-operates a parity check result ERRB, a second command SMP_CMD, and a second chip select signal SMP_CS and outputs the same, and an operation result obtained from the NAND operator may pass at least one inverter to output an internal command Int_CMD.

If a delayed parity check result ERRB has a first level (e.g., when no parity error is generated), a normal memory operation is performed as an internal command Int_CMD is generated according to states of a second command SMP_CMD and a second chip select signal SMP_CS. On the other hand, when a delayed parity check result ERRB has a second level (e.g., when a parity error is generated), generation of an internal command Int_CMD according to a second command SMP_CMD and a second chip select signal SMP_CS is blocked to prevent an incorrect memory operation.

Meanwhile, the parity check unit 3220 may include an operation unit 3221 that includes XOR logic operators. Also, the parity check unit 3220 may further include a flip flop 3222 that operates in response to a first chip select signal CMP_CS0 such that a parity check result Res_CHK is provided when a chip select signal CS is activated. The operation unit 3221 provides an operation result regarding a first command/address SMP_CMD0/ADD0 and a first parity SMP_parity0 to an input end of the flip flop 3222 and an operation result regarding a first chip select signal SMP_CS0 to an output end of the flip flop 3222. An operation result regarding the first chip select signal SMP_CS0 may be simply a signal obtained by delaying the first chip select signal SMP_CS0. The flip flop 3222 outputs a parity check result Res_CHK in response to activation of the delayed first chip select signal SMP_CS0.

Figure 18D:
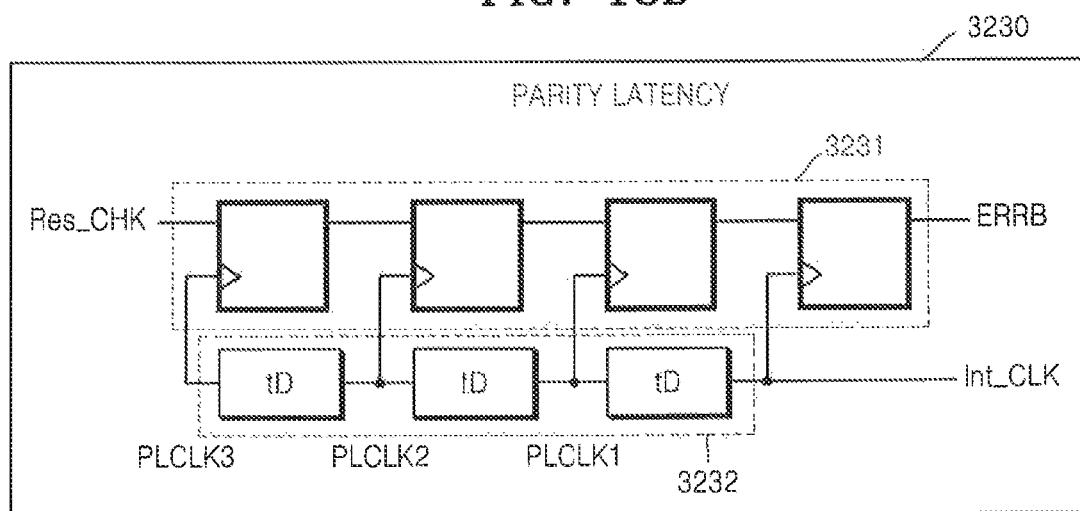
Figure 18E:
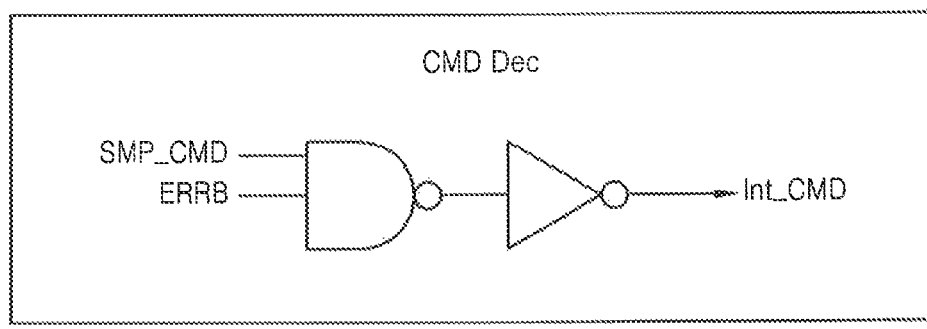

FIG. 18D illustrates an example of the parity latency 3230 which receives a parity check result Res_CHK from the parity check unit 3220 and delays the same to generate a delayed parity check result ERRB. The parity latency 3230 may include at least one flip flop 3231 and at least one delay unit 3232 for delaying an internal clock signal Int_CLK in a semiconductor memory device, and a parity check result Res_CHK passes through serially connected flip flops and is output as a delayed parity check result ERRB. FIG. 18E illustrates an example of logic circuit usable for blocking the command upon an active parity error signal ERRB.

Figure 19:
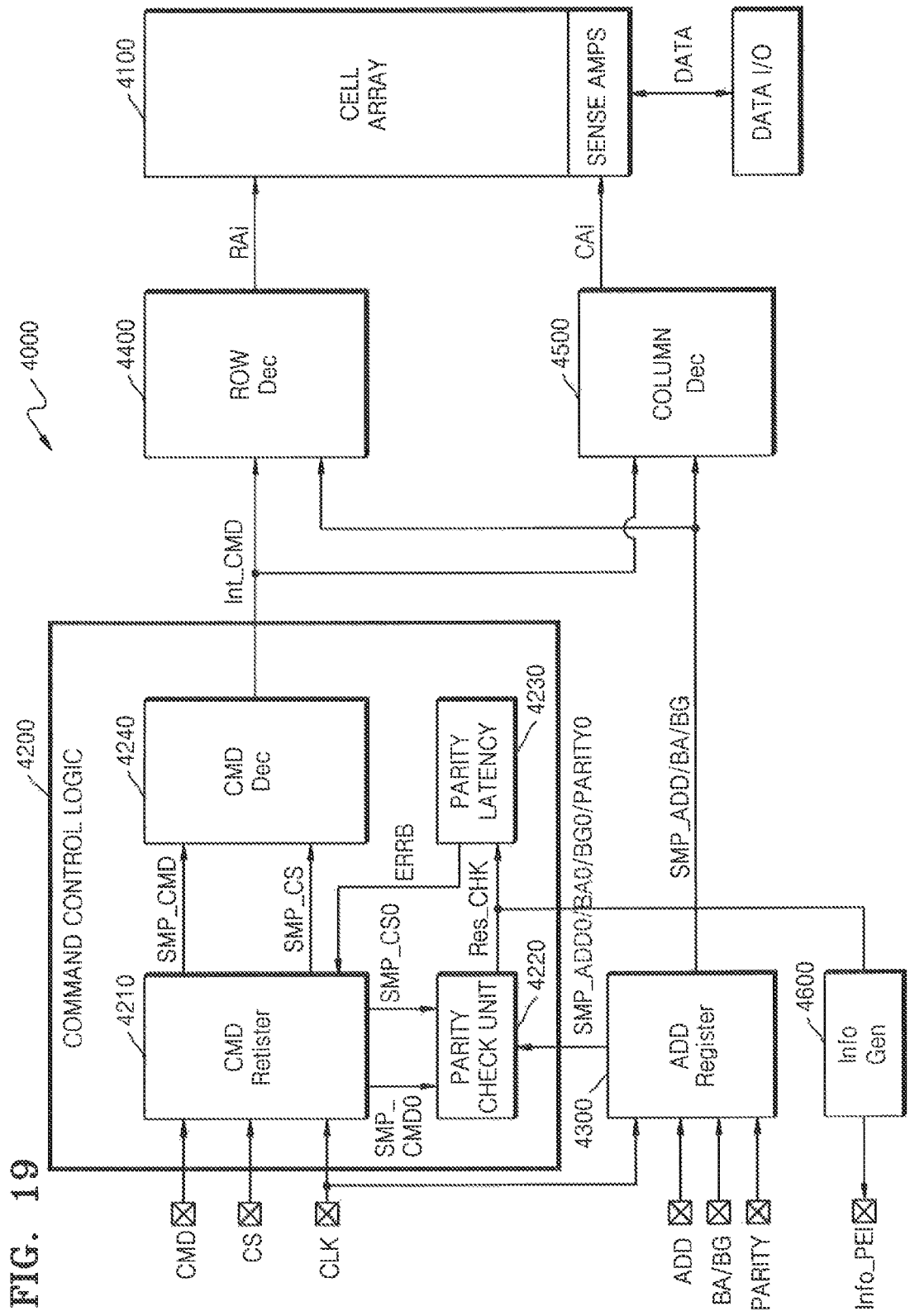
FIG. 19 is a block diagram of a semiconductor memory device according to another embodiment of the inventive concept.

FIG. 19 is a block diagram illustrating a semiconductor memory device according to another embodiment of the inventive concept.

As illustrated in FIG. 19, a DRAM 4000 included as a semiconductor memory device includes a DRAM cell array 4100, a command control logic unit 4200, an address register 4300, a row decoder 4400, a column decoder 4500, and an information generator 4600. Also, the command control logic unit 4200 may include a command register 4210, a parity check unit 4220, a parity latency 4230, and a command decoder 4240. Elements illustrated in FIG. 19 that are identical or similar to those described above with reference to FIG. 17 operate in the same or similar manner.

The command control logic unit 4200 may receive a command CMD, a chip select signal CS, and a clock signal CLK. The command CMD and the chip select signal CS are stored in the command register 4210 in synchronization with the clock signal CLK. The parity check unit 4220 may perform a parity check operation in response to a first chip select signal SMP_CS0. For example, the parity check unit 4220 may receive a first command SMP_CMD0, a first address SMP_ADD0/BA0/BG0, and a first parity signal SMP_Parity0 to perform a parity check operation and output a parity check result Res_CHK. The parity latency 4230 receives a parity check result Res_CHK and delays the same to output a delayed parity check result ERRB. When a parity error is generated, to block generation of an internal command Int_CMD including an error, provision of a second command SMP_CMD and a second chip select signal SMP_CS to the command decoder 4240 may be blocked. To this end, the delayed parity check result ERRB sent from the parity latency 4230 may be provided to the command register 4210. The command register 4210 responds to the parity check result ERRB to block provision of the second command SMP_CMD and the second chip select signal SMP_CS to the command decoder 4240.

Figure 20A:
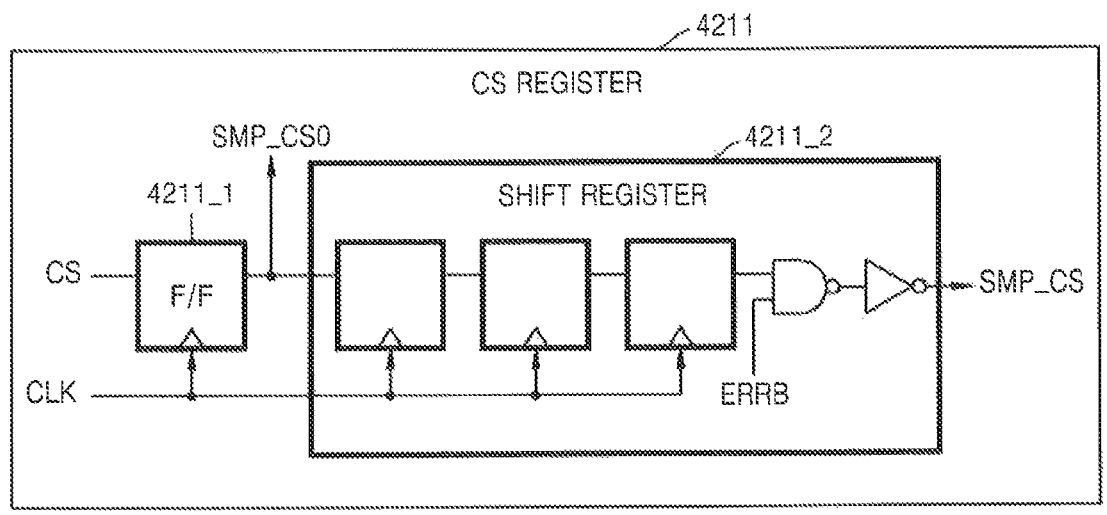
FIGS. 20A and 20B are circuit diagrams of components included in the semiconductor memory device of FIG. 19 according to an embodiment of the inventive concept.
Figure 20B:
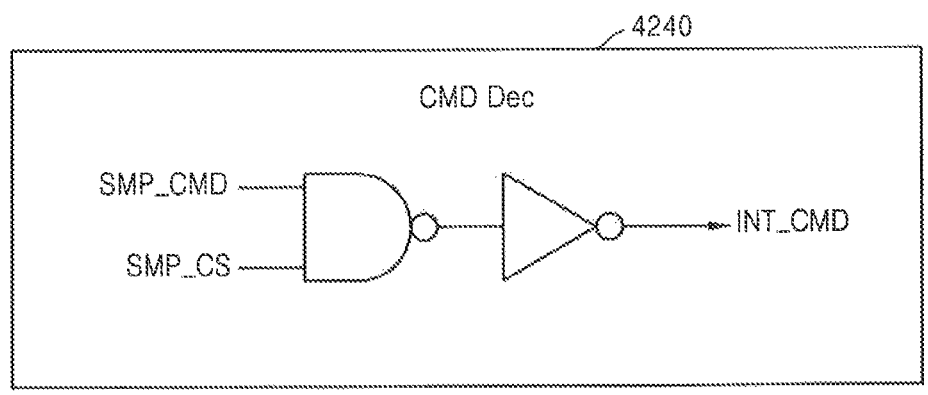

FIGS. 20A and 20B are circuit diagrams illustrating components included in the semiconductor memory device of FIG. 19 according to an embodiment of the inventive concept.

FIG. 20A illustrates an example of a chip select signal register 4211 included in the command register 4210 of FIG. 19. While not shown in FIG. 20A, a register for storing a command may be further included in the command register 4210.

The chip select signal register 4211 may include a flip flop 4211_1 and a shift register 4211_2. The flip flop 4211_1 stores or outputs a chip select signal CS in response to a clock signal CLK. An output from the flip flop 4211_1 may be defined as a first chip select signal CMP_CS0.

The first chip select signal SMP_CS0 may be provided as an input of the shift register 4211_2. The amount of delay of the first chip select signal SMP_CS0 may be set according to the number of flip flops included in the shift register 4211_2. Besides the flip flops for delaying the first chip select signal SMP_CS0, the shift register 4211_2 may include logic devices for controlling an output of a second select signal SMP_CS in response to the delayed parity check result ERRB. For example, the shift register 4211_2 may include a NAND gate and an inverter. A delayed parity check result ERRB is provided to an input end of the NAND gate, and when a parity error is generated, output of the second chip select signal SMP_CS from the shift register 4211_2 is blocked.

FIG. 20B illustrates the command decoder 4240 having a NAND operator and an inverter but more NAND operators and more inverters may also be included. As a delayed parity check result ERRB is provided to the command register 4210, generation of an internal command Int_CMD including an error is prevented, the NAND operator of the command decoder 4240 may logic-operate the second command SMP_CMD and the second chip select signal SMP_CS to generate an internal command Int_CMD.

Figure 21:
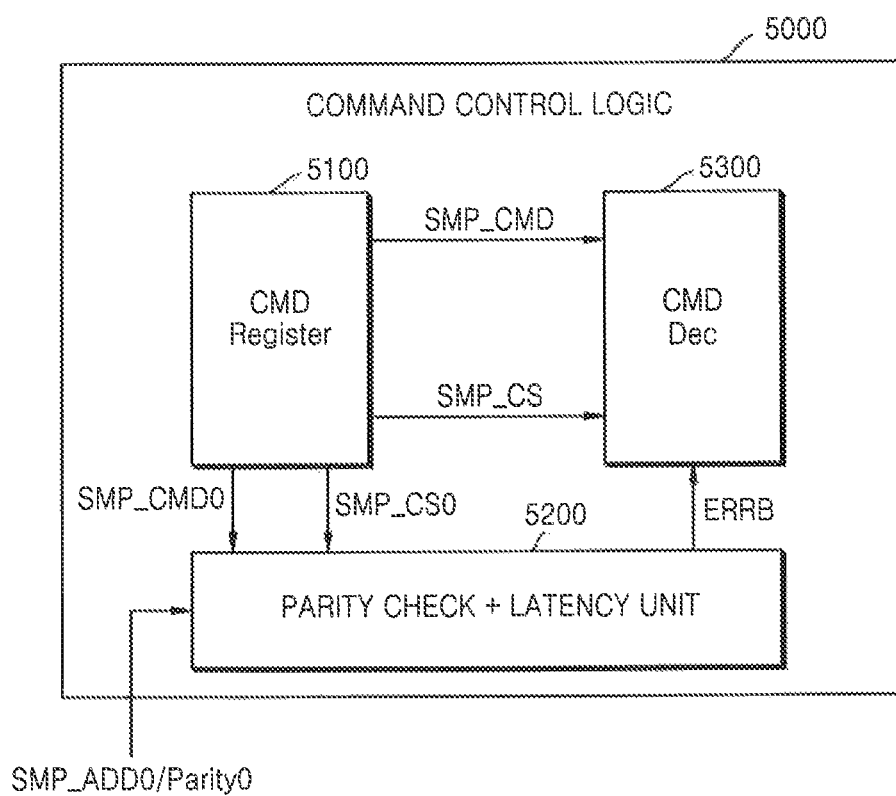
FIG. 21 is a circuit diagram of a command control logic unit included in a semiconductor memory device according to another embodiment of the inventive concept.

FIG. 21 is a circuit diagram illustrating a command control logic unit 5000 included in a semiconductor memory device according to another embodiment of the inventive concept.

The command control logic unit 5000 may include a command register 5100, a parity check and latency unit 5200, and a command decoder 5300. In FIG. 21, a parity check operation and a delay operation with respect to a parity check result are illustrated.

The command register 5100 provides a first command SMP_CMD0 and a first chip select signal SMP_CS0 to the parity check and latency unit 5200. The command decoder 5300 receives a delayed parity check result ERRB, and also receives a second command SMP_CMD and a second chip select signal SMP_CS from the command register 5100. If no parity error is generated, the command register 5100 decodes the second command SMP_CMD and the second chip select signal SMP_CS to output an internal command.

The parity check and latency unit 5200 may perform a parity check operation in response to the first chip select signal SMP_CS0, and may receive a first command SMP_CMD0, a first address SMP_ADD0, and a first parity signal SMP_parity0 for a parity check operation. The parity check and latency unit 5200 may include at least one operator for a parity check (e.g., XOR operators) and may include a flip flop as at least one delay device to delay the parity check result.

Figure 22:
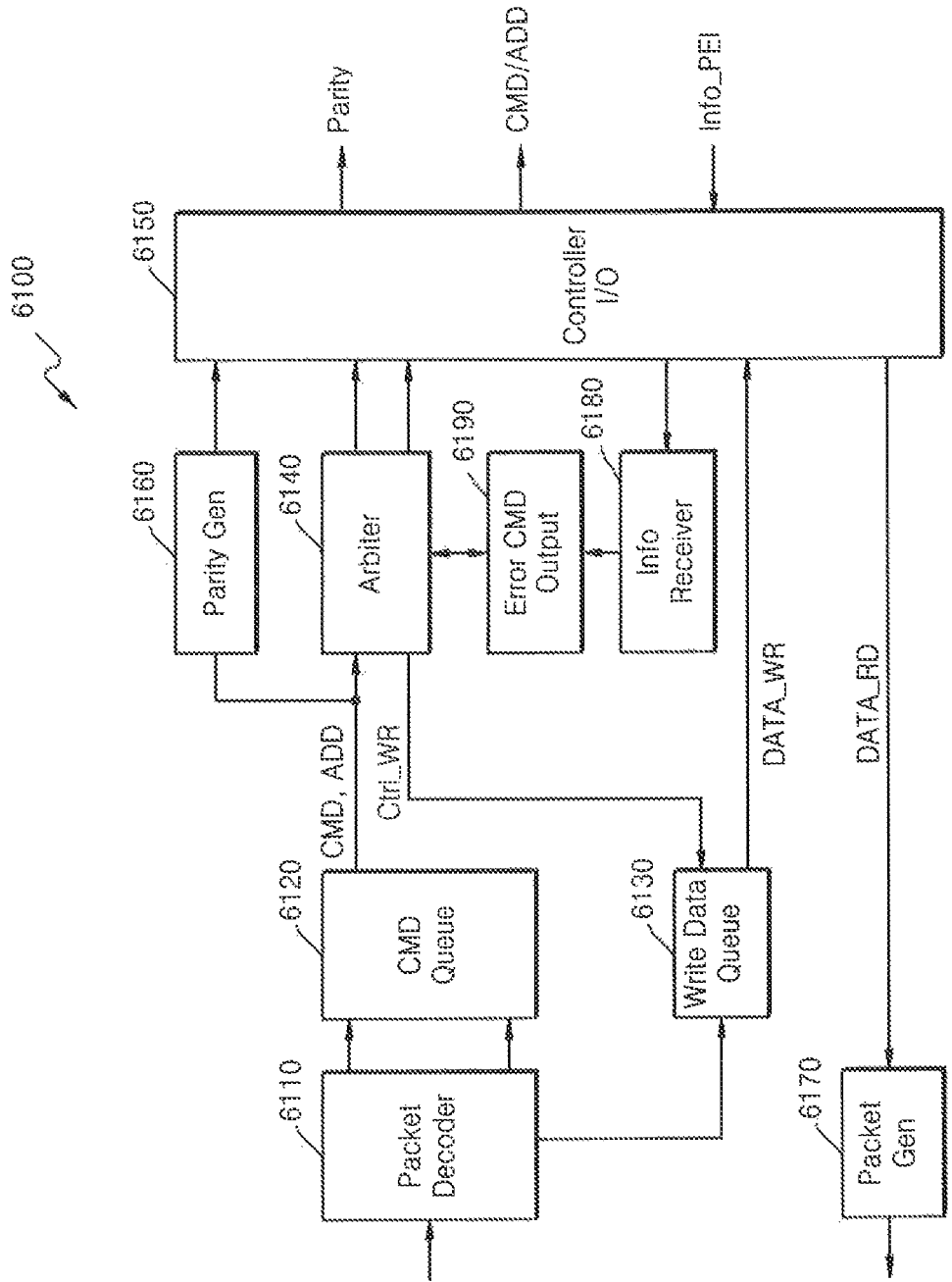
FIG. 22 is a block diagram of a memory controller according to an embodiment of the inventive concept.

FIG. 22 is a block diagram illustrating a memory controller 6100 according to an embodiment of the inventive concept. The memory controller 6100 may include a packet decoder 6110, a command queue 6120, a write data queue 6130, an arbiter 6140, a controller input/output unit 6150, and a packet generator 6170. Also, according to the current embodiment of the inventive concept, the memory controller 6100 may further include a parity signal generator 6160, an information receiver 6180, and an error command output control unit 6190.

The packet decoder 6110 receives a packet including information for accessing a semiconductor memory device and decodes the packet. As the packet is decoded, a command CMD and an address ADD corresponding thereto may be generated. For example, a command CMD and an address ADD may be generated per packet, or a plurality of commands CMD and a plurality of addresses ADD may be generated per packet.

The command queue 6120 may store multiple commands CMD and multiple addresses ADD, and queues the commands CMD and the addresses ADD in the order in which they are input. The command queue 6120 may operate in a first in first out (FIFO) manner in which information that is first inserted into a list is also removed first.

The arbiter 6140 receives a plurality of commands CMD and a plurality of addresses ADD corresponding to the commands CMD, which are stored in the command queue 6120, and controls the commands CMD and the addresses ADD to be executed according to priorities. Execution of the commands CMD and the addresses ADD may refer to an operation of outputting the commands CMD and the addresses ADD according to priorities. Meanwhile, the write data queue 6130 receives a write control signal Ctrl_WR from the arbiter 6140, and outputs data transmitted from the packet decoder 6130 to the controller input/output unit 6150 in response to a write control signal Ctrl_WR. The packet generator 6170 may receive data read from the semiconductor memory device to generate a packet, and the generated packet may be output to an external device, for example, a central processing unit (not shown).

The controller input/output unit 6150 may define an interface between transmission media and provides mechanical, electrical, and functional procedural units for signal transmission between data link layers. The controller input/output unit 6150 transmits a command CDM, an address ADD, and data DATA or the like generated in the memory controller 6100 to a semiconductor memory device.

According to the current embodiment of the inventive concept, the parity signal generator 6160 generates a parity signal Parity based on bit values of a command CMD and an address ADD output by using the memory controller 6100. For example, from among bits constituting a command CMD and an address ADD, a bit value of the parity signal Parity may be determined according to the number of bits having a logic high.

Meanwhile, the information receiver 6180 may receive parity error information Info_PEI output from the semiconductor memory device, and controls output of a command CMD and an address ADD to the semiconductor memory device based on the received parity error information Info_PEI. For example, as the parity error information Info_PEI is activated, when a parity error is generated in a command CMD and an address ADD that were output a predetermined number of clock cycles before, the command CMD and the address ADD in which the error is generated are controlled to be output to the semiconductor memory device again.

The error command output control unit 6190 controls output of the command CMD and the address ADD in which a parity error is generated, according to a state of the parity error information Info PET that is received by using the information receiver 6180. The error command output control unit 6190 may include a predetermined storage unit therein (e.g., a register), and in addition to information indicating a command CMD and an address ADD that are output to the semiconductor memory device, a flag indicating whether a parity error is generated with respect to the command CMD and the address ADD may be stored in the storage unit.

The error command output control unit 6190 may use the arbiter 3140 to control the command CMD and the address ADD in which a parity error is generated, to be provided to the semiconductor memory device again. The command CMD and the address ADD provided to the semiconductor memory device may be temporarily stored in the command queue 6120 or the arbiter 6140. When activated parity error information Info_PEI is received, whether a parity error is generated in a command CMD and an address ADD that are output a predetermined number of clock cycles before the parity error information Info_PEI is received may be determined, and accordingly, the command CMD and the address ADD in which a parity error is generated, which are stored in the command queue 6120 or the arbiter 6140 are provided to the semiconductor memory device again. In an alternative embodiment, the memory controller 6100 may, based on receipt of the parity error signal associated with address or command issued, adjust the parity latency by issuing a mode register set (MRS) command (not shown), along with the re-issued address/command previously identified to include an error.

Figure 23:
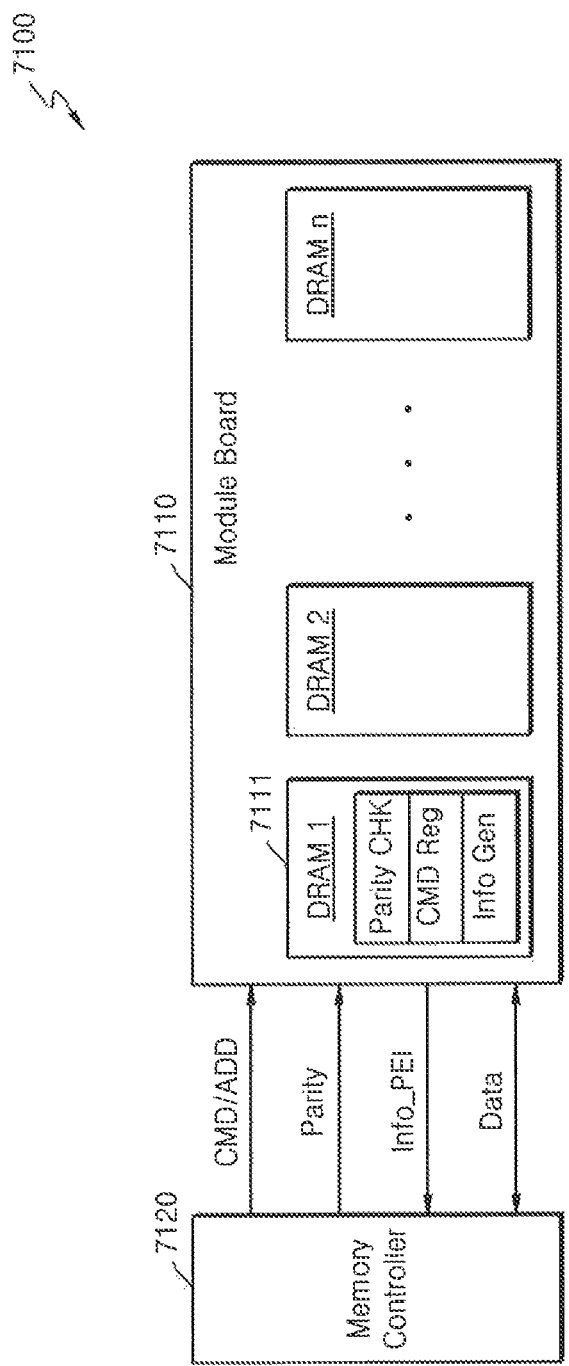
FIG. 23 is a block diagram of a memory system to which a semiconductor memory device according to an embodiment of the inventive concept is applied.

FIG. 23 is a block diagram of a memory system 7100 to which a semiconductor memory device according to an embodiment of the inventive concept is applied, according to an embodiment of the inventive concept. The memory system 7100 includes a memory module 7110 and a memory controller 7120. Also, the memory module 7110 includes at least one semiconductor memory device 7111 mounted on a module board, and the semiconductor memory device 7111 may be, for example, a DRAM chip. Also, the semiconductor memory device 7111 may be a DRAM in any of the embodiments of the inventive concept described above.

The memory controller 7120 outputs various signals for controlling the semiconductor memory device 7111 included in the memory module 711. For example, the memory controller 7120 outputs various signals such as a command CMD, an address ADD, and data Data for a memory operation, and outputs a parity signal Parity for a parity check with respect to the command CMD and the address ADD provided to the semiconductor memory device 7111 according to the current embodiment of the inventive concept.

A parity check unit for a parity check with respect to the command CMD and/or the address ADD may be included in the semiconductor memory device 7111, and also, an information generator for generating parity error information Info_PEI according to a parity check result may also be included.

Figure 24:
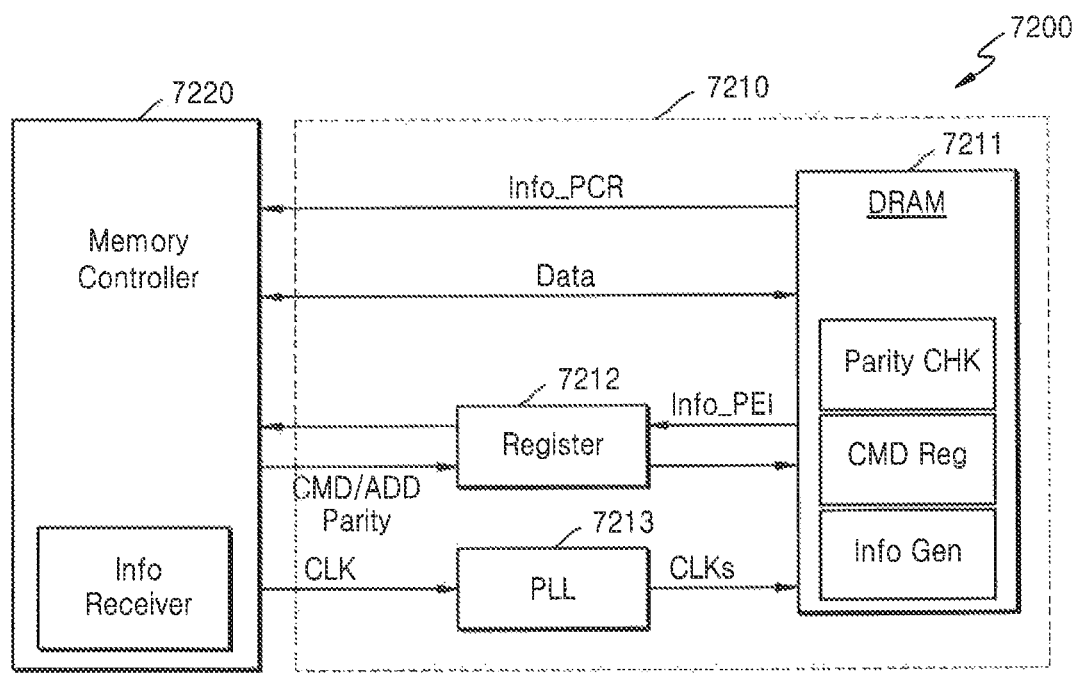
FIG. 24 is a block diagram of a memory system to which a semiconductor memory device according to an embodiment of the inventive concept is applied.

FIG. 24 is a block diagram illustrating a memory system 7200 in which a semiconductor memory device is applied, according to another embodiment of the inventive concept.

The memory system 7200 includes a memory module 7210 and a memory controller 7220, and the memory module 7210 is a semiconductor device that includes at least one DRAM chip 7211. The memory module 7210 of FIG. 24 illustrates an example in which a registered dual in-line memory module (RDIMM), which is a server module, is applied, and a register 7212 and a phase locked loop (PLL) 7213 or the like may be mounted on a module board of the memory module 7210.

The memory module 7210 and the memory controller 7220 transmit or receive a signal via various systems busses. The register 7212 buffers a command CMD and an address ADD, and provides the buffered command CMD and the buffered address ADD to the DRAM chip 7211. According to the above-described embodiments of the inventive concept, the register 7212 further receives and buffers a parity signal Parity and provides the parity signal Parity to the DRM chip 7211. Also, the PLL 7213 receives a clock signal CLK and controls a phase thereof, and provides phase-adjusted clock signals CLKs to the DRAM chip 7211.

In addition, as in the above-described embodiments, a parity check unit that performs a parity check with respect to a command CMD and/or an address ADD may be included in the DRAM chip 7211, and an information generator for generating various types of information Info_PEI according to a parity check result may be included. In addition, a command register may be included, which delays and outputs a command CMD so that the command CMD is provided to the command decoder in synchronization with a timing when a parity check result is provided to the command decoder.

Figure 25A:
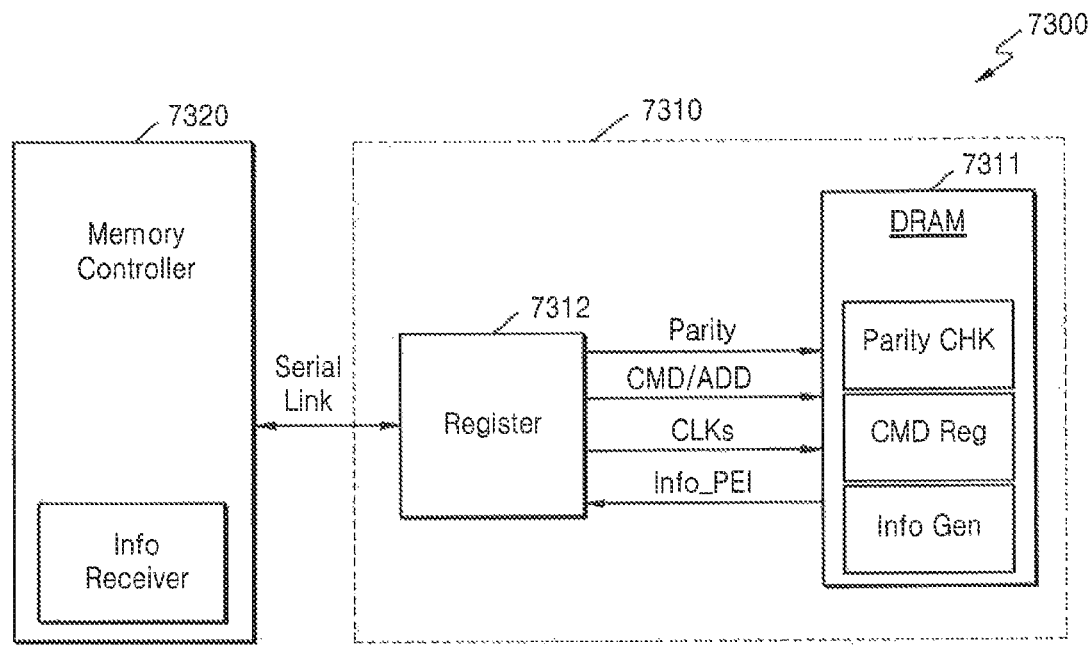
FIGS. 25A and 25B are block diagrams of a memory system in which a semiconductor memory device according to an embodiment of the inventive concept is applied.
Figure 25B:
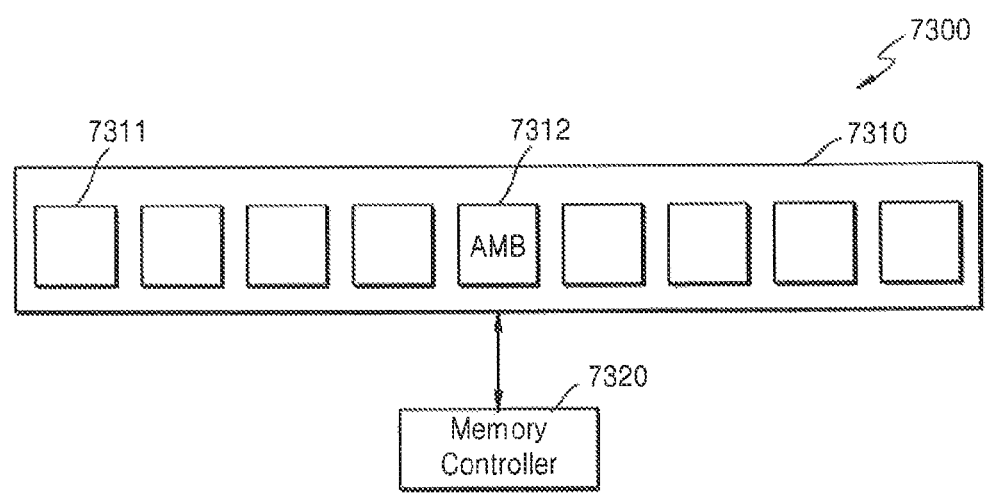

FIGS. 25A and 25B are block diagrams illustrating a memory system 7300 in which a semiconductor memory device is applied, according to another embodiment of the inventive concept. A memory module 7310 of FIGS. 25A and 25B is an example in which a fully-buffered DIMM (FB-DIMM) is applied.

The memory system 5300 includes a memory module 5310 and a memory controller 7320, and the memory module 7310 includes at least one DRAM chip 7311 and at least one advanced memory buffer (AMB) 7312. The memory module 7310 that is in the form of a FBDIMM communicates with the memory controller 7320, and the memory controller 7320 and the AMB 7312 in the memory module 7310 are connected to each other in a point-to-point manner to perform serial communication. Accordingly, the number of memory modules 7310 connecting to the memory system 7300 may be increased, and thus a large capacity may be provided, and also, as a FBDIMM uses a packet protocol, the memory system 7300 may be operated at high speed.

As in the above-described embodiment, in addition to reception of typical command CMD/address ADD and clock signals CLKs via the DRAM chip 7311, a parity signal for a parity check with respect to a command CMD and/or an address ADD may be provided to the DRAM chip 7311, and also, parity error information Info_PEI may be provided to the memory controller 7320. Also, the DRAM chip 7311 may further include a command register that delays and outputs a command CMD so that the command CMD is provided to the command decoder in synchronization with a timing when a parity check result is provided to the command decoder, in addition to a parity check unit that performs a parity check and an information generator that outputs parity error information Info_PEI.

While a RDIMM or a FBDIMM is applied in the above-described embodiments, the embodiments of the inventive concept are not limited thereto. The embodiments of the inventive concept may be applied to a semiconductor memory device, a memory module, or a system in various forms, and may also be applied to other types of memory modules such as a single in-line memory module (SIMM), a dual in-line memory module (DIMM), a small-outline DIMM (SO-DIMM), a unbuffered DIMM (UDIMM), a rank-buffered DIMM (RBDIMM), a mini-DIMM, and a micro-DIMM.

Figure 26:
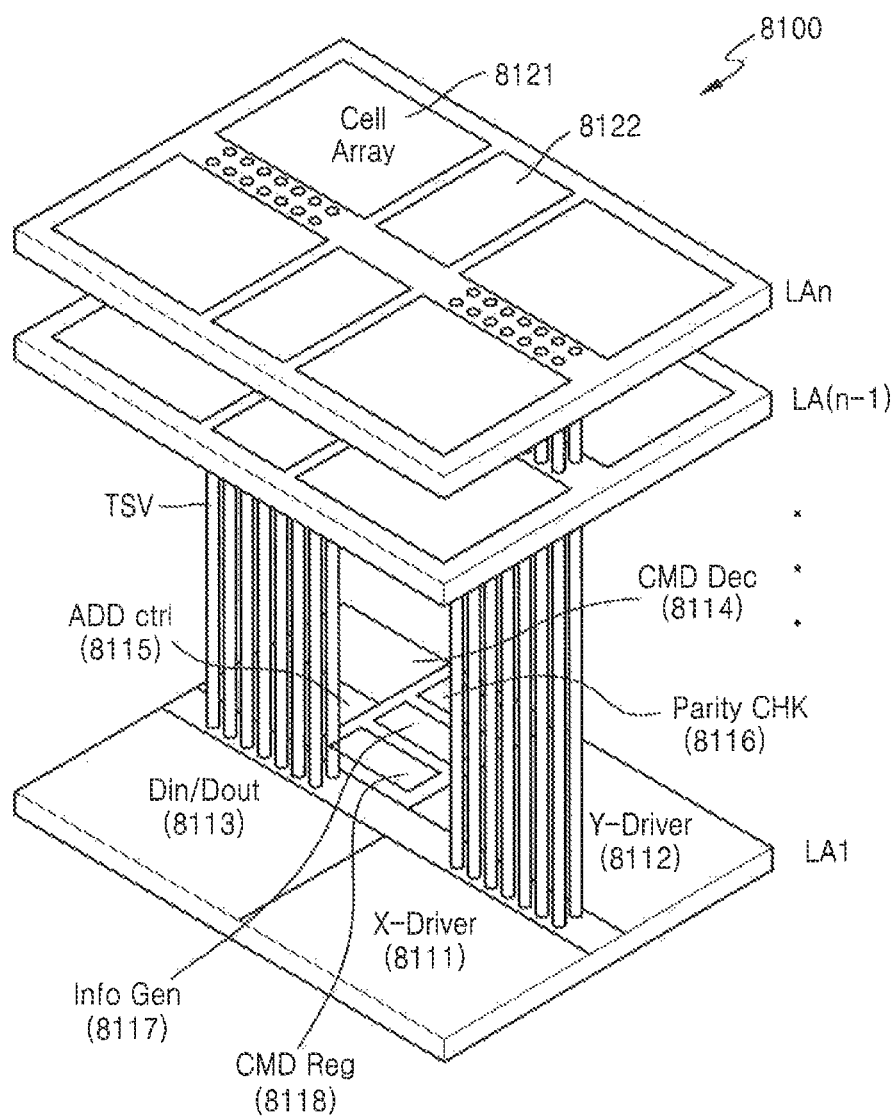
FIG. 26 is a structural diagram of a semiconductor memory device according to another embodiment of the inventive concept.

FIG. 26 is a structural diagram illustrating a semiconductor memory device 8100 according to another embodiment of the inventive concept. FIG. 26 illustrates the semiconductor memory device 8100 formed by stacking a plurality of semiconductor layers.

The semiconductor memory device 8100 may include a plurality of semiconductor layers. A first semiconductor layer LA1 through an n-th semiconductor layer LAn may each be a DRAM chip including a DRAM cell, or some of the semiconductor layers LA1 through LAn may be master chips that perform interfacing with respect to an external memory controller while the rest may be slave chips that store data. In the embodiment of FIG. 26, the lowermost, first semiconductor layer LA1 is assumed to be a master chip, and the rest of the semiconductor layers LA2 through LAn are assumed to be slave chips.

The plurality of semiconductor layers LA1 through LAn transmit or receive a signal with respect to one another via a through silicon via TSV, and the master chip LA1 communicates with a memory controller via a conductive unit (not shown) formed on an external surface thereof. A structure and operation of the semiconductor memory device 8100 will be described below while focusing on the first semiconductor layer LA1 as a master chip and an n-th semiconductor layer LAn as a slave chip.

The first semiconductor layer LA1 includes various circuits for driving a cell array 8121 included in the slave chips. For example, the first semiconductor layer LA1 may include a row driver (X-driver) 8111 for driving a word line of the cell array 8121, a column driver (Y-driver) 8112 for driving a bit line, a data input/output unit 8113 for controlling input and output of data, a command decoder 8114 that decodes a command CMD from the outside, and an address buffer 8115 that receives an address externally and outputs row and column addresses.

Also, as in the above-described embodiments, the first semiconductor layer LA1 may include a parity check unit 8116 that receives a parity signal and performs a parity check with respect to a command CMD and/or an address ADD. The first semiconductor layer LA1 may also include an information generator 8117 that generates parity error information according to a parity check result and a command register 8118 that delays and outputs a command CMD so that the command CMD is provided to the command decoder in synchronization with the timing when a parity check result is provided to the command decoder.

Figure 27:
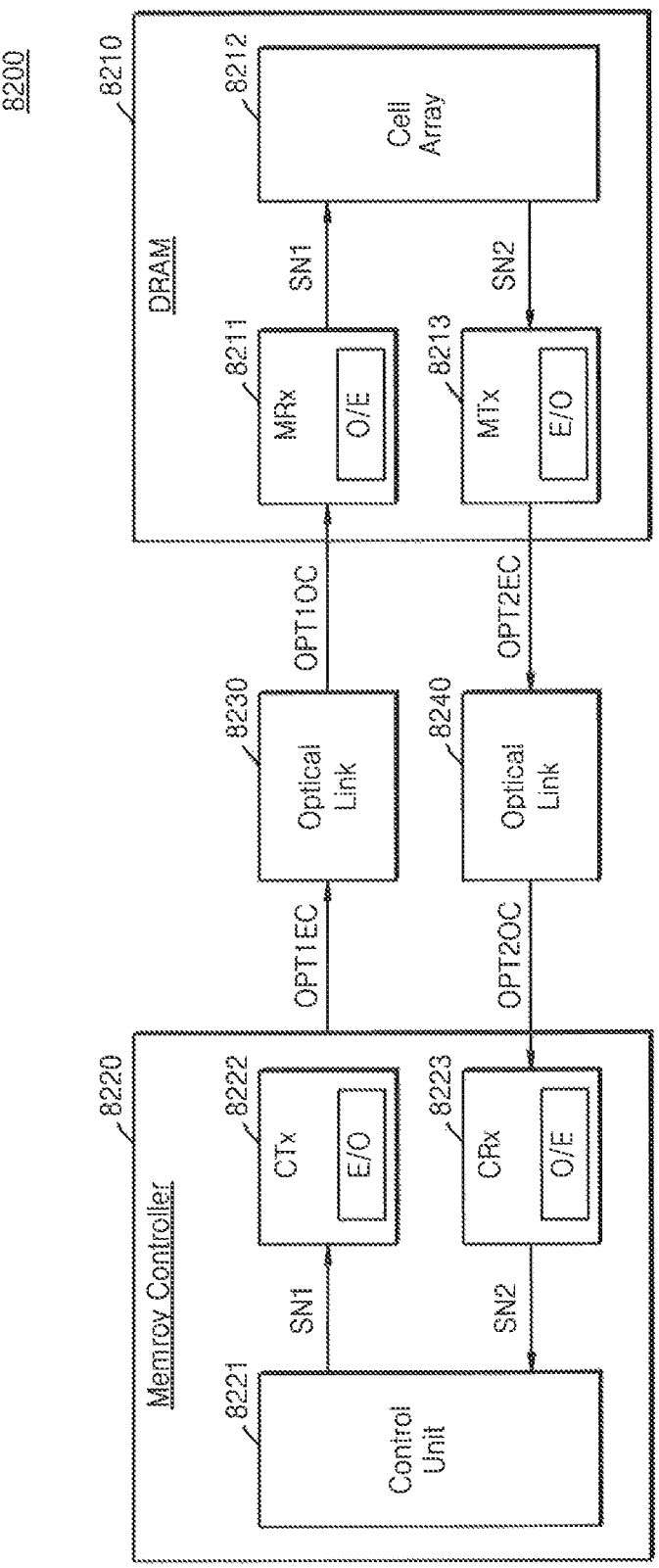
FIG. 27 is a block diagram of a memory system in which a semiconductor memory device according to an embodiment of the inventive concept is applied.

Meanwhile, the n-th semiconductor layer LAn may include the cell array 8121 and other peripheral circuits for driving the cell array 8121. For example, a row/column selecting unit (not shown) for selecting rows and columns of the cell array 8121 and a bit line sense amp (not shown) or the like may be included in a peripheral circuit region 8122, FIG. 27 is a block diagram of a memory system 8200, according to another embodiment of the inventive concept. The memory system 8200 includes optical linking devices 8230 and 8240 and a semiconductor memory device 8210. As the semiconductor memory device 8200, a DRAM chip is illustrated.

Optical linking devices 8230 and 8240 interconnect the memory controller 8220 and the semiconductor memory device 8210. The memory controller 8220 includes a control unit 8221, a first transmitting unit 8222, and a first receiver 8223. The control unit 8221 transmits a first electrical signal SN1 to the first transmitting unit 8222. The first electrical signal SN1 may include a command, a clock signal, an address, data, or the like that are transmitted to the semiconductor memory device 8210. Also, according to the current embodiment of the inventive concept, the first electrical signal SN1 may include a buffer read command for accessing data stored in a data buffer (not shown) in the semiconductor memory device 8210.

The first transmitting unit 8222 includes an optical modulator E/O, and the optical modulator DO converts the first electrical signal SN1 to a first light transmission signal OPT1EC and transmits the same to the optical linking device 8230. The first receiver 8223 includes an optical decoder O/E, and the optical decoder O/E converts a second light reception signal OPT2OC received from the optical linking device 8240 to a second electrical signal SN2 and transmits the same to the control unit 8221.

The semiconductor memory device 8210 includes a second receiver 8211, a cell array 8212, and a second transmitting unit 8213. The second receiver 8211 includes an optical decoder O/E, and the optical decoder O/E converts a first light reception signal OPT1OC received from the optical linking device 8230 to a first electrical signal SN1 and transmits the same to the cell array 8212.

The cell array 8212 writes data to a memory cell in response to a first electrical signal SN1 and transmits read data to the second transmitting unit 8213 as a second electrical signal SN2. The second electrical signal SN2 may include a clock signal, read data, or the like, that are transmitted to the memory controller 8220. The second transmitting unit 8213 converts the second electrical signal SN2 to a second optical transmission signal OPT2EC and transmits the same to an optical linking device 8240. The second optical transmission signal OPT2EC may transmit to the optical linking device 8240 via serial communication.

The semiconductor memory device 8210 may further include a parity check unit that performs a parity check with respect to a command CMD and/or an address ADD and an information generator for generating parity error information according to a parity check result. Also, the semiconductor memory device 8210 may further include a command register that delays output of a command CMD provided to the command decoder.

Figure 28:
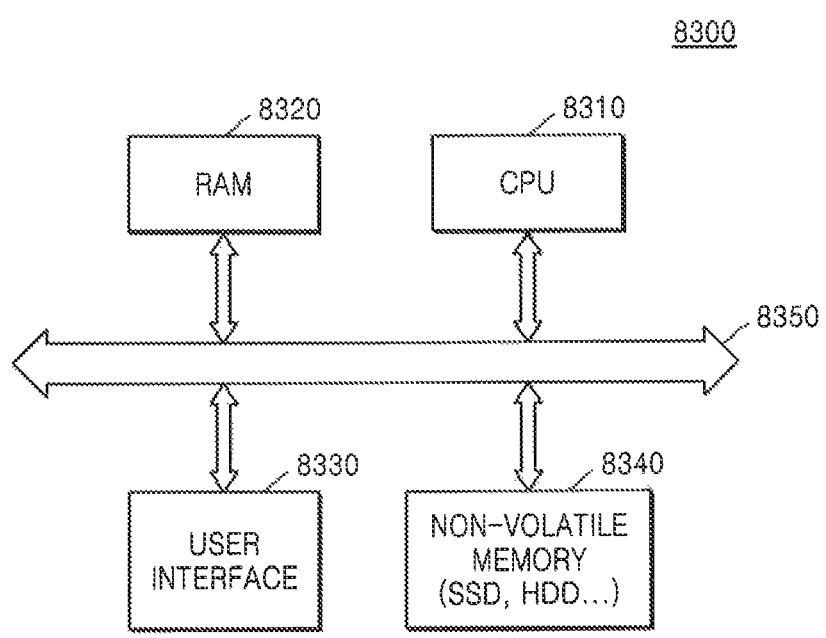
FIG. 28 is a block diagram of a computing system including a memory system according to an embodiment of the inventive concept.

FIG. 28 is a block diagram illustrating a computing system 8300 in which a memory system according to an embodiment of the inventive concept is mounted. In the computing system 8300 such as a mobile device or a desktop computer, a RAM 8320 may be mounted as a semiconductor memory device according to the current embodiment of the inventive concept. Any one of the semiconductor memory devices according to the above-described embodiments of the inventive concept may be applied. For example, the RAM 8320 may be formed of one of the semiconductor memory devices of the embodiments of the inventive concept or may be in the form of a memory module. Also, the RAM 8320 of FIG. 28 may include a semiconductor memory device and a memory controller.

The computing system 8300 according to the current embodiment of the inventive concept includes a central processing unit 8310, a RAM 8320, a user interface 8330, and a non-volatile memory 8340, which are electrically connected via a bus 8350. As the non-volatile memory 8340, a large capacity storage device such as a solid state disk (SSD) or a hard disk drive (HDD) may be used.

In the computing system 8300, the RAM 8320 may include, as in the above-described embodiments, a parity check unit that performs a parity check with respect to a command CMD and/or an address ADD and an information generator for generating parity error information according to a parity check result. Also, the RAM 8320 may further include a command register to delay output of a command provided to the command decoder.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
a parity check unit configured to receive a command signal and a parity signal to perform error checking in the command signal and output a parity indication signal;
a delay unit including a plurality of registers configured to time delay the parity indication signal and output a delayed parity indication signal;
a command register configured to time delay the command signal and output a delayed command signal; and
a decoder configured to decode the delayed command signal,
wherein the delayed parity indication signal is provided to the decoder in synchronization with the delayed command signal and controls output of an internal command signal from the decoder to be prevented.

2. The semiconductor memory device of claim 1, wherein the parity check unit performs the error checking based on a state of the chip select signal.

3. The semiconductor memory device of claim 1, wherein the parity check unit further receives an address, and performs the error checking by using the command signal, the address, and the parity signal.

4. The semiconductor memory device of claim 3, thither including an address register configured to time delay the address and output a delayed address.

5. The semiconductor memory device of claim 3, wherein the address comprises a bank address and a hank group address.

6. The semiconductor memory device of claim 1, further including a chip select register configured to time delay the chip select signal and output a delayed chip select signal.

7. The semiconductor memory device of claim 6, wherein the decoder is further configured to pass or block the delayed command signal based on the state of the delayed chip select signal.

8. A semiconductor memory device comprising:
a parity check unit configured to receive a chip select signal, command signals, address signals and a parity signal to perform error checking in the command signals and the address signals and output a parity indication signal;
a delay unit including a plurality of registers configured to time delay the parity indication signal and output a delayed parity indication signal;
a command register configured to time delay the command signals and output delayed command signals;
an address register configured to time delay the address signals and output delayed address signals; and
a decoder configured to pass or block the delayed address signals based on the delayed parity indicator signal,
wherein a value of the parity indication signal is based on an operation result by using the chip select signal, command signals, address signals and the parity signal.

9. The semiconductor memory device of claim 8, wherein the parity check unit performs the error checking based on a state of the chip select signal.

10. The semiconductor memory device of claim 8, wherein the address comprises a bank address and a bank group address.

11. The semiconductor mentor device of claim 9, further including a chip select register configured to time delay the chip select signal and output a delayed chip select signal.

12. The semiconductor memory device of claim 11, wherein the decoder is further configured to pass or block the delayed address signals based on the state of the delayed chip select signal.

13. A method of controlling a memory device, comprising:
receiving a command and address signals and a parity signal to perform error checking in the command and address signals and outputting a parity indication signal;
time delaying the parity indication signal and outputting a delayed parity indication signal;
time delaying the command and address signals and outputting delayed command and address signals;
decoding the delayed command signal,
wherein the delayed parity indication signal is provided to the decoder in synchronization with the delayed command signal and controls output of an internal command signal from the decoder to be prevented.

14. The method of claim 13, wherein the error checking is based on a state of the chip select signal.

15. The method of claim 13, further including receiving an address, and performing the error checking by using the command, the address, and the parity signal.

16. The method of claim 15, further including time delaying the address and output a delayed address.

17. The method of claim 15, wherein the address comprises a bank address and a bank group address.

18. The method of claim 13, further including time delaying the chip select signal and output a delayed chip select signal.

19. The method of claim 18, wherein the passing or blocking of the delayed command signal is based on the state of the delayed chip select signal.

20. A memory system comprising:
a memory controller configured to control access to and from a memory device, the memory controller comprising:
a parity signal generator configured to generate a parity signal based on bit values of a command;
an information receiver configured to receive parity error information from the memory device; and
an error command output control unit configured to control outputting of the command to the memory device based on a state of the parity error information; and
the memory device comprising:
a parity check unit configured to receive the command and the parity signal to perform error checking in the command and output a parity indication signal;
a delay unit including a plurality of registers configured to time delay the parity indication signal and output a delayed parity indication signal;
a command register configured to time delay the command and output a delayed command; and
a decoder configured to decode the delayed command signal,
wherein the delayed parity indication signal is provided to the decoder in synchronization with the delayed command signal and controls output of an internal command signal from the decoder to be prevented.

21. The system according to claim 20, wherein the parity check unit of the memory device further receives an address, and performs the error checking by using the command, the address, and the parity signal.

22. The system according to claim 21, wherein the memory device further includes an address register configured to time delay the address and output a delayed address.

23. The system according to claim 20, wherein the memory device comprises at least one DRAM chip mounted on a memory board.

24. The system according to claim 20, wherein the memory device is a fully-buffered DIMM (FBDIMM) including at least one DRAM chip and at least one advanced memory buffer (AMB).

25. The system according to claim 20, wherein the memory device is one of a single in-line memory module (SIMM), a dual inline memory module (DIMM), a small-outline DIMM (SO-DIMM), a unbuffered DIMM (UDIMM), a rank-buffered DIMM (RBDIMM), a mini-DIMM, and a micro-DIMM.

26. The system according to claim 20, wherein the memory device includes a stack of semiconductor layers, each layer having a DRAM chip including a DRAM cell.

27. The system according to claim 20, further including an optical link configured to transmit and receive optical signals between the memory controller and the memory device.

* * * * *